US012745045B2

(12) United States Patent
Kim et al.

(10) Patent No.: US 12,745,045 B2
(45) Date of Patent: Sep. 22, 2026

(54) MICROPHONE DEVICE BASED ON TWO-DIMENSIONAL PIEZOELECTRIC MATERIAL LAYER HAVING PROTECTIVE LAYER FORMED THEREON, AND METHOD FOR FABRICATING THE SAME

(71) Applicants: UIF (University Industry Foundation), Yonsei University, Seoul (KR); RESEARCH & BUSINESS FOUNDATION SUNGKYUNKWAN UNIVERSITY, Suwon-si (KR)

(72) Inventors: Sang Woo Kim, Seoul (KR); So Hee Kim, Seoul (KR); Young Jun Kim, Suwon-si (KR); Hyeon Yeong Lee, Seoul (KR); Fengyi Pang, Seoul (KR)

(73) Assignees: UIF (University Industry Foundation), Yonsei University, Seoul (KR); RESEARCH & BUSINESS FOUNDATION SUNGKYUNKWAN UNIVERSITY, Suwon-si (KR)

(*) Notice: Subject to any disclaimer, the term of this patent is extended or adjusted under 35 U.S.C. 154(b) by 47 days.

(21) Appl. No.: 18/824,149

(22) Filed: Sep. 4, 2024

(65) Prior Publication Data

US 2025/0088807 A1 Mar. 13, 2025

(30) Foreign Application Priority Data

Sep. 7, 2023 (KR) ........................ 10-2023-0119238
Sep. 11, 2023 (KR) ........................ 10-2023-0120503
Sep. 11, 2023 (KR) ........................ 10-2023-0120598

(51) Int. Cl.
*H04R 17/02* (2006.01)
*H04R 31/00* (2006.01)
(Continued)

(52) U.S. Cl.
CPC ........... *H04R 17/02* (2013.01); *H04R 31/003* (2013.01); *H10N 30/076* (2023.02);
(Continued)

(58) Field of Classification Search
CPC .............................. H04R 17/02; H04R 13/003
See application file for complete search history.

(56) References Cited

U.S. PATENT DOCUMENTS

2016/0090303 A1 3/2016 Zinn et al.
2018/0192203 A1* 7/2018 Umeda .................. H10N 30/30
(Continued)

FOREIGN PATENT DOCUMENTS

KR 10-2011-0029812 A 3/2011
KR 10-2011-0095195 A 8/2011
KR 10-2013-0022083 A 3/2013
KR 10-2016-0069517 A 6/2016
KR 10-2018-0038855 A 4/2018

OTHER PUBLICATIONS

Lee, Sung Q., et al. "MEMS acoustic sensor using PMN-PT single-crystal diaphragm." Optomechatronic Actuators, Manipulation, and Systems Control. vol. 6374. SPIE, 2006, (10 pages).
(Continued)

*Primary Examiner* — Suhan Ni
(74) *Attorney, Agent, or Firm* — NSIP Law

(57) ABSTRACT

An excellent ultra-small microphone device with improved mechanical properties due to a protective layer formed on an upper and/or lower surface of a two-dimensional material having piezoelectric properties is provided to replace a conventional MEMS (Micro-Electro Mechanical Systems) microphone device. In the microphone device, the protective layer of a thickness of several hundred nm is formed on the upper and/or lower surface of the two-dimensional TMD material to protect the piezoelectric material layer during a back etching process and to contribute to the mechanical stability of the device.

26 Claims, 18 Drawing Sheets

(51) Int. Cl.
*H10N 30/00* (2023.01)
*H10N 30/076* (2023.01)
*H10N 30/079* (2023.01)
*H10N 30/853* (2023.01)

(52) U.S. Cl.
CPC ......... *H10N 30/079* (2023.02); *H10N 30/708* (2024.05); *H10N 30/853* (2023.02)

(56) References Cited

U.S. PATENT DOCUMENTS

| 2020/0290865 | A1* | 9/2020 | Umeda | H03H 3/0072 |
|---|---|---|---|---|
| 2021/0050506 | A1* | 2/2021 | Xia | H10N 30/708 |

OTHER PUBLICATIONS

Ozdogan, Mehmet, et al, "Fabrication and experimental characterization of a MEMS microphone using electrostatic levitation." 2019 IEEE Sensors. IEEE, 2019.
Cho, Seungse, et al. "Highly Stretchable Sound-in-Display Electronics Based on Strain-Insensitive Metallic Nanonetworks." Advanced Science 8.1 (2021): 2001647.
Ali, Washim Reza, et al, "Piezoelectric based MEMS acoustic sensor for wide frequency applications." IEEE Sensors Journal 21.24 (2021): 27352-27360.

* cited by examiner

Deep RIE on back-side

MICROPHONE DEVICE BASED ON TWO-DIMENSIONAL PIEZOELECTRIC MATERIAL LAYER HAVING PROTECTIVE LAYER FORMED THEREON, AND METHOD FOR FABRICATING THE SAME

CROSS-REFERENCE TO RELATED APPLICATION(S)

The present disclosure relates to a microphone device based on a two-dimensional This application claims the benefit under 35 USC 119(a) of Korean Patent Application Nos. 10-2023-0119238, filed with the Korean Intellectual Property Office on Sep. 7, 2023, 10-2023-0120503, filed on Sep. 11, 2023, and 10-2023-0120598, filed on Sep. 11, 2023, the disclosures of which are incorporated herein by reference in its entirety.

BACKGROUND

Field

The present disclosure relates to a microphone device based on a two-dimensional piezoelectric material layer having a protective layer formed thereon. Additionally, the present disclosure relates to a microphone device based on a two-dimensional piezoelectric material layer having a protective layer formed thereon, in which surface structures are formed via surface patterning on and/or in a lower protective layer. Furthermore, the present disclosure relates to a microphone device based on a two-dimensional piezoelectric material layer having a protective layer formed thereon, in which the microphone device is capable of detecting both piezoelectric characteristics in a $d_{11}$ direction and a $d_{33}$ direction using not only horizontally-arranged electrodes but also vertically-arranged electrodes (upper electrode and lower electrode).

Description of Related Art

A microphone device is a device that converts sound into an electrical signal, and refers to a device that generates an electric signal representing a frequency of the sound. Recently, as the microphone device used in earphones, headphones, and smartphones is becoming increasingly miniaturized, the need for an ultra-small microphone device that is light, thin, and consume less power is increasing.

The most common microphone device operation scheme is a dynamic scheme in which a coil and a permanent magnet are used, thereby making miniaturization of the device difficult and thus, making the device to be used in an embedded manner. Therefore, recently, a scheme in which an ultra-small microphone device is manufactured in a silicon wafer based on a semiconductor process scheme such as micro electro mechanical system (MEMS) is being used.

In addition, there are a capacitive scheme and a condenser scheme. In both schemes, change in capacitance based on change in a spacing between two parallel plates (fixed plates or diaphragms) is detected. In a microphone device with a condenser scheme, a constant voltage should be applied thereto to maintain a charge amount during an operation thereof. The thinner the parallel plates, the narrower the spacing therebetween, and the higher the applied voltage, the higher the sensitivity may be obtained. However, when the diaphragm made of a dielectric material film such as polysilicon nitride film or silicon oxide film is too thin, the mechanical strength thereof is low. When the diaphragm is too thick, the diaphragm may easily break. When the spacing between the two parallel plates is too small, the two parallel plates are vulnerable to external environments such as shock and vibration. When the applied voltage is high, the static deformation of the diaphragm increases, so that the shock resistance and dynamic measurement range are reduced. In aa electret condenser microphone (ECM) scheme in which an electret is applied to a condenser scheme microphone, the electret that stores electrons semi-permanently therein is used as the diaphragm or the fixed plate. In the ECM scheme, permanent electric polarization is present such that an external power source is absent, which is not the case for a general condenser scheme microphone. Further, the ECM scheme microphone is cheap and it is easy to manufacture ECM scheme microphone and thus the ECM scheme microphone is often used as a low-cost microphone device in small mobile devices. However, the ECM scheme microphone has poor response characteristics and it is difficult for the ECM scheme microphone to operate at high temperatures because the ECM scheme microphone uses a polymer as a material of the diaphragm.

Next, there is proposed a microphone device using ceramic-based piezoelectric material such as PZT($PbZr_{1-x}Ti_xO_3$), SBT($SrBi_2Ta_2O_9$), BLT($Bi_{4-x}La_xTi_3O_{12}$), $PbTiO_3$, or $BaTiO_3$ or a film-type polymer such as polyvinylidene fluoride (PVDF) with piezoelectric properties. When the piezoelectric material is used, the device may operate at low voltage and may be advantageously miniaturized and may be produced in a thin film manner. However, the sound output and sensitivity are lower than those of a conventional microphone device using the coil and the electromagnet. When using the piezoelectric ceramic, the ceramic may easily break due to the material nature thereof, and some of the piezoelectric ceramics are harmful to the human body. Furthermore, when using PVDF having the piezoelectric properties as a ferroelectric polymer, the device cannot operate at high temperatures and the PVDF has inferior piezoelectric properties compared to the ceramic-based material. Further, heat treatment is essential to form a PVDF β-phase with piezoelectric properties, and that aging occurs over time such that an output of the device decreases over time.

Korean Patent No. 10-1903420 (titled as Microphone and Manufacturing Method Thereof) attempts to implement a microphone device in which horizontally-arranged electrodes are formed on a transition metal chalcogenide (TMD) two-dimensional material layer such that a piezoelectric output in the $d_{11}$ direction is achieved. Since the two-dimensional material is used as a material of the piezoelectric layer, the microphone device exhibits high sensitivity even at low-frequency sound pressure, and residual stress is reduced. According to Korean Patent No. 10-1903420 as shown in FIG. 1, the two-dimensional piezoelectric material layer is formed on a substrate, and a cavity or hole is formed in the substrate via back side etching. That is, the two-dimensional piezoelectric material of several nm in thickness is suspended, and thus is easily damaged when being repeatedly exposed to the sound pressure, and further, the two-dimensional piezoelectric material is inevitably damaged when the back side of the substrate is etched to form the cavity therein.

SUMMARY

A purpose of the present disclosure is to provide an excellent ultra-small microphone device with improved mechanical properties due to a protective layer formed on an upper and/or lower surface of a two-dimensional material layer having piezoelectric properties, wherein the excellent ultra-small microphone device may replacing the conventional MEMS (Micro-Electro Mechanical Systems) microphone device Further, another purpose of the present disclosure is to provide a method for fabricating an ultra-small microphone device capable of detecting high frequencies via patterning a surface of a lower protective layer formed on a lower surface of a two-dimensional material having piezoelectric properties.

Further, still another purpose of the present disclosure is to provide an ultra-small microphone device capable of detecting $d_{33}$ piezoelectric properties using vertically-arranged electrodes (upper and lower electrodes) acting as a stopper structure respectively formed on upper and lower surfaces of the two-dimensional material having piezoelectric properties.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

A first aspect of the present disclosure provides a microphone device based on a two-dimensional piezoelectric material layer having a protective layer formed thereon, the microphone device comprising: a substrate including a cavity vertically extending therethrough; a lower protective layer formed on an upper surface of the substrate so as to block the cavity; a two-dimensional piezoelectric material layer formed on the lower protective layer; and at least one electrode, wherein the microphone device is configured to generate an electric potential as the two-dimensional piezoelectric material layer vibrates under a negative pressure.

In accordance with some embodiments of the first aspect, the microphone device further comprises an upper protective layer formed on the two-dimensional piezoelectric material layer.

In accordance with some embodiments of the first aspect, each of the lower protective layer and the upper protective layer is made of a material having a lattice parameter similar to a lattice parameter of the two-dimensional piezoelectric material layer.

In accordance with some embodiments of the first aspect, each of the lower protective layer and the upper protective layer includes one of $Al_2O_3$, BN, hBN, $HfO_2$, $SiO_2$, ZnO, $TiO_2$.

In accordance with some embodiments of the first aspect, at least one of the lower protective layer and the upper protective layer is patterned into a mesh structure.

In accordance with some embodiments of the first aspect, the two-dimensional piezoelectric material layer is made of one of a transition metal chalcogenide, an alkaline earth metal oxide, and a group III-V compound, In accordance with some embodiments of the first aspect, the two-dimensional piezoelectric material layer includes a stack of 1 to 5 two-dimensional piezoelectric material layers.

In accordance with some embodiments of the first aspect, a through-cavity has a circular shape in a plan view of the microphone device.

In accordance with some embodiments of the first aspect, the microphone device further comprises: an additional substrate disposed on the other surface of the substrate having the cavity defined therein so as to block the cavity; and a lower stopper disposed on the additional substrate so as to be received in the cavity.

In accordance with some embodiments of the first aspect, the microphone device further comprises an upper stopper disposed on the upper protective layer.

In accordance with some embodiments of the first aspect, a plurality of surface structures, each having an upwardly gradually narrower shape, are disposed and arranged in and/or on in the lower protective layer, wherein the two-dimensional piezoelectric material layer is formed on the plurality of surface structures of the lower protective layer in a conformal manner to the plurality of surface structures of the lower protective layer.

In accordance with some embodiments of the first aspect, a plurality of surface structures, each having an upwardly gradually narrower shape, are disposed and arranged on the substrate, wherein the lower protective layer is formed on the plurality of surface structures of the substrate in a conformal manner to the plurality of surface structures of the substrate, wherein the two-dimensional piezoelectric material layer is formed on the lower protective layer in a conformal manner to the plurality of surface structures of the substrate.

In accordance with some embodiments of the first aspect, the microphone device further comprises a packaging layer disposed on a lower surface of the substrate so as to block the cavity, wherein the at least one electrode includes: at least two horizontally-arranged electrodes disposed on the two-dimensional piezoelectric material layer, and arranged and spaced apart from each other in a horizontal direction; an upper electrode disposed between adjacent ones of the at least two horizontally-arranged electrodes; and a lower electrode disposed on an upper surface of the packaging layer, wherein a plurality of surface structures, each having an upwardly gradually narrower shape, are disposed and arranged in and/or on in the lower protective layer, wherein the two-dimensional piezoelectric material layer is formed on the plurality of surface structures of the lower protective layer in a conformal manner to the plurality of surface structures of the lower protective layer.

In accordance with some embodiments of the first aspect, the microphone device further comprises an upper protective layer formed on the two-dimensional piezoelectric material layer, wherein the horizontally-arranged electrodes and the upper electrode are disposed on the upper protective layer.

In accordance with some embodiments of the first aspect, the microphone device further comprises a conductive layer attached to a lower surface of the lower protective layer and received in the cavity.

In accordance with some embodiments of the first aspect, the microphone device further comprises a packaging layer disposed on a lower surface of the substrate so as to block the cavity, wherein the at least one electrode includes: at least two horizontally-arranged electrodes disposed on the two-dimensional piezoelectric material layer, and arranged and spaced apart from each other in a horizontal direction; an upper electrode disposed between adjacent ones of the at least two horizontally-arranged electrodes; and a lower electrode disposed on an upper surface of the packaging layer, wherein a plurality of surface structures, each having an upwardly gradually narrower shape, are disposed and arranged on the substrate, wherein the lower protective layer is formed on the plurality of surface structures of the substrate in a conformal manner to the plurality of surface structures of the substrate, wherein the two-dimensional piezoelectric material layer is formed on the lower protective layer in a conformal manner to the plurality of surface structures of the substrate.

In accordance with some embodiments of the first aspect, the microphone device further comprises an upper protective layer formed on the two-dimensional piezoelectric material layer, wherein the horizontally-arranged electrodes and the upper electrode are disposed on the upper protective layer.

In accordance with some embodiments of the first aspect, the microphone device further comprises a conductive layer attached to a lower surface of the lower protective layer and received in the cavity.

A second aspect of the present disclosure provides a method for manufacturing a microphone device based on a two-dimensional piezoelectric material layer having a protective layer formed thereon, the method comprising: preparing a substrate; forming a lower protective layer on an upper surface of the substrate; forming a two-dimensional piezoelectric material layer on the lower protective layer; forming an upper protective layer on the two-dimensional piezoelectric material layer; forming at least one electrode; and etching a lower surface of the substrate so as to form a cavity vertically extending through the substrate, wherein the microphone device is configured to generate an electric potential as the two-dimensional piezoelectric material layer vibrates under a negative pressure.

In accordance with some embodiments of the second aspect, each of the lower protective layer and the upper protective layer is made of a material having a lattice parameter similar to a lattice parameter of the two-dimensional piezoelectric material layer.

In accordance with some embodiments of the second aspect, each of the lower protective layer and the upper protective layer includes one of $Al_2O_3$, BN, hBN, $HfO_2$, $SiO_2$, ZnO, $TiO_2$.

In accordance with some embodiments of the second aspect, at least one of the lower protective layer and the upper protective layer is patterned into a mesh structure.

In accordance with some embodiments of the second aspect, the two-dimensional piezoelectric material layer is made of one of a transition metal chalcogenide, an alkaline earth metal oxide, and a group III-V compound, In accordance with some embodiments of the second aspect, the two-dimensional piezoelectric material layer includes a stack of 1 to 5 two-dimensional piezoelectric material layers.

In accordance with some embodiments of the second aspect, each of the lower protective layer and the upper protective layer is formed using atomic layer deposition (ALD).

In accordance with some embodiments of the second aspect, the two-dimensional piezoelectric material layer is formed via sputtering and heat treatment.

In accordance with some embodiments of the second aspect, a plurality of surface structures, each having an upwardly gradually narrower shape, are disposed and arranged in and/or on in the lower protective layer, wherein the two-dimensional piezoelectric material layer is formed on the plurality of surface structures of the lower protective layer in a conformal manner to the plurality of surface structures of the lower protective layer.

In accordance with some embodiments of the second aspect, a plurality of surface structures, each having an upwardly gradually narrower shape, are disposed and arranged on the substrate, wherein the lower protective layer is formed on the plurality of surface structures of the substrate in a conformal manner to the plurality of surface structures of the substrate, wherein the two-dimensional piezoelectric material layer is formed on the lower protective layer in a conformal manner to the plurality of surface structures of the substrate.

A third aspect of the present disclosure provides a method for manufacturing a microphone device based on a two-dimensional piezoelectric material layer having a protective layer formed thereon, the method comprising: preparing a sacrificial substrate and depositing a two-dimensional piezoelectric material layer on the sacrificial substrate; removing the two-dimensional piezoelectric material layer from the sacrificial substrate; preparing a substrate having a lower protective layer formed on an upper surface of the substate; transferring the two-dimensional piezoelectric material layer onto the lower protective layer; forming, on the two-dimensional piezoelectric material layer, two or more horizontally-arranged electrodes and an upper electrode disposed between adjacent ones of the two or more horizontally-arranged electrodes, wherein the two or more horizontally-arranged electrodes are arranged so as to be spaced apart from each other in a horizontal direction; etching a lower surface of the substrate to form a cavity vertically extending therethrough; and attaching a packaging substrate having a lower electrode formed on an upper surface thereof to the lower surface of the substrate such that the lower electrode is received in the cavity, thereby blocking the cavity with the packing substrate, wherein a plurality of surface structures, each having an upwardly gradually narrower shape, are disposed and arranged in and/or on in the lower protective layer, wherein the two-dimensional piezoelectric material layer is formed on the plurality of surface structures of the lower protective layer in a conformal manner to the plurality of surface structures of the lower protective layer, wherein the microphone device is configured to generate an electric potential as the two-dimensional piezoelectric material layer vibrates under a negative pressure.

In accordance with some embodiments of the third aspect, the method further comprises, transferring the two-dimensional piezoelectric material layer onto the lower protective layer, forming an upper protective layer on the two-dimensional piezoelectric material layer, wherein the horizontally-arranged electrodes and the upper electrode are formed on the upper protective layer.

In accordance with some embodiments of the third aspect, the method further comprises attaching a conductive layer to a lower surface of the lower protective layer so as to be received in the cavity.

A fourth aspect of the present disclosure provides a method for manufacturing a microphone device based on a two-dimensional piezoelectric material layer having a protective layer formed thereon, the method comprising: preparing a sacrificial substrate and depositing a two-dimensional piezoelectric material layer on the sacrificial substrate; removing the two-dimensional piezoelectric material layer from the sacrificial substrate; preparing a substrate having a lower protective layer formed on an upper surface of the substate; transferring the two-dimensional piezoelectric material layer onto the lower protective layer; forming, on the two-dimensional piezoelectric material layer, two or more horizontally-arranged electrodes and an upper electrode disposed between adjacent ones of the two or more horizontally-arranged electrodes, wherein the two or more horizontally-arranged electrodes are arranged so as to be spaced apart from each other in a horizontal direction; etching a lower surface of the substrate to form a cavity vertically extending therethrough; and attaching a packaging substrate having a lower electrode formed on an upper surface thereof to the lower surface of the substrate such that the lower electrode is received in the cavity, thereby blocking the cavity with the packing substrate, wherein a plurality of surface structures, each having an upwardly gradually narrower shape, are disposed and arranged on the substrate, wherein the lower protective layer is formed on the plurality of surface structures of the substrate in a conformal manner to the plurality of surface structures of the substrate, wherein the two-dimensional piezoelectric material layer is formed on the lower protective layer in a conformal manner to the plurality of surface structures of the substrate, wherein the microphone device is configured to generate an electric potential as the two-dimensional piezoelectric material layer vibrates under a negative pressure.

In accordance with some embodiments of the fourth aspect, the method further comprises, transferring the two-dimensional piezoelectric material layer onto the lower protective layer, forming an upper protective layer on the two-dimensional piezoelectric material layer, wherein the horizontally-arranged electrodes and the upper electrode are formed on the upper protective layer.

In accordance with some embodiments of the fourth aspect, the method further comprises attaching a conductive layer to a lower surface of the lower protective layer so as to be received in the cavity.

According to the present disclosure, the protective layer of several hundred nm in thickness is formed on the upper and/or lower surface of the two-dimensional TMD material to protect the piezoelectric material layer during the back etching process and to contribute to the mechanical stability.

According to the present disclosure, the two-dimensional piezoelectric material is formed on the surface structures of the lower protective layer in the conformal manner thereto to detect a high-frequency range such as ultrasound.

According to the present disclosure, the electrodes are arranged in the horizontal direction as well as in the vertical direction, such that simultaneous measurement of the piezoelectric characteristics in the di direction and the $d_{33}$ direction, thereby achieving high sensitivity of the microphone device.

In addition to the effects as described above, specific effects in accordance with the present disclosure will be described together with following detailed descriptions for carrying out the disclosure.

DETAILED DESCRIPTIONS

Figure 1:
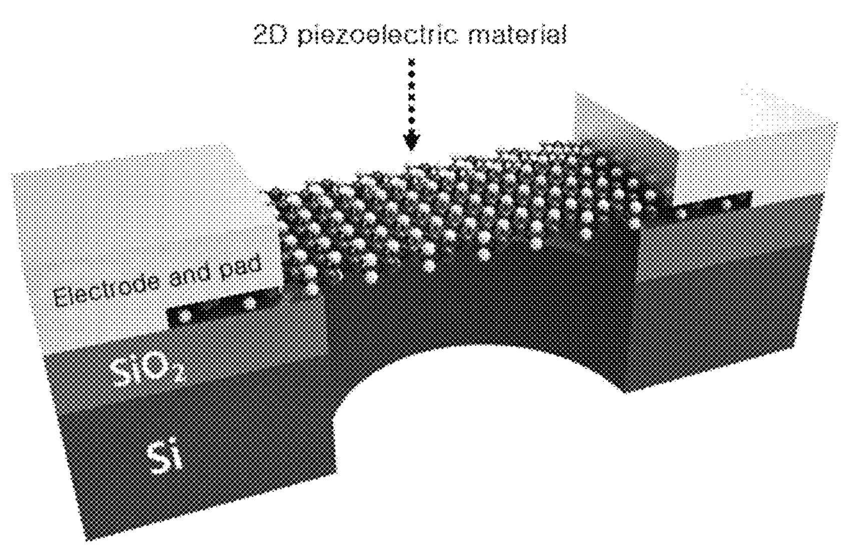
FIG. 1 is a diagram of a structure of a microphone device based on a two-dimensional piezoelectric material as disclosed in Korean Patent No. 10-1903420.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may include within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between and connected to the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between and connected to the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between and connected to the former and the latter. Further, as used herein, when a layer, film, region, plate, or the like may be disposed "below" or "under" another layer, film, region, plate, or the like, the former may directly contact the latter or still another layer, film, region, plate, or the like may be disposed between and connected to the former and the latter. As used herein, when a layer, film, region, plate, or the like is directly disposed "below" or "under" another layer, film, region, plate, or the like, the former directly contacts the latter and still another layer, film, region, plate, or the like is not disposed between and connected to the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various embodiments of the present disclosure may be partially or entirely combined with each other, and may be technically associated with each other or operate with each other. The embodiments may be implemented independently of each other and may be implemented together in an association relationship.

The present disclosure discloses a MEMS microphone device based on a two-dimensional piezoelectric material layer having upper and lower protective layers formed thereon. The present disclosure discloses the MEMS microphone device based on the two-dimensional piezoelectric material layer having the upper and lower protective layers formed thereon, in which surface structures are formed via surface patterning on and/or in the lower protective layer or the substrate. The present disclosure discloses the MEMS microphone device based on the two-dimensional piezoelectric material layer having the upper and lower protective layers formed thereon, in which the MEMS microphone device is capable of detecting two piezoelectric characteristics using upper and lower electrodes. In the following descriptions, duplicate descriptions will be omitted.

1. MEMS Microphone Device Based on Two-Dimensional Piezoelectric Material Having Upper and Lower Protective Layers Formed Thereon First, the present disclosure discloses the MEMS microphone device based on two-dimensional piezoelectric material having upper and lower protective layers formed thereon and a method for manufacturing the same. The two-dimensional piezoelectric material-based MEMS microphone device proposed in the present disclosure operates as a microphone device based on an electrical output generated from the two-dimensional piezoelectric material vibrating under sound pressure. Since the piezoelectric layer is very thin at several nm, the piezoelectric layer has very excellent sensitivity, but is vulnerable to repeated sound pressure, impact, and etching processes. To compensate for this weakness, the present disclosure discloses the MEMS microphone device based on the two-dimensional piezoelectric material layer having the upper and/or lower protective layers formed thereon.

FIG. 1 is a diagram of a structure of a microphone device based on two-dimensional piezoelectric material of Korean Patent No. 10-1903420. The present disclosure provides a structure in which a protective layer is formed on an upper surface and/or a lower surface of the piezoelectric material layer in the structure of Korean Patent No. 10-1903420, thereby protecting the two-dimensional piezoelectric material layer during etching and improving mechanical stability thereof.

Figure 2:
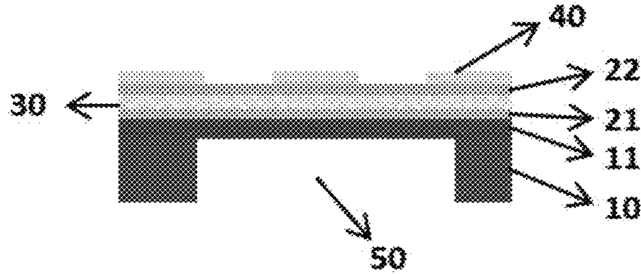
FIG. 2 is a cross-sectional view showing a structure of a microphone device based on a two-dimensional piezoelectric material layer having a protective layer formed thereon according to one embodiment of the present disclosure.

FIG. 2 is a cross-sectional view showing a structure of a microphone device based on a two-dimensional piezoelectric material layer having a protective layer formed thereon according to an embodiment of the present disclosure.

As shown in FIG. 2, the microphone device based on the two-dimensional piezoelectric material layer having the protective layer formed thereon according to an embodiment of the present disclosure includes a substrate 10 having a cavity vertically extending therethrough; a lower protective layer 21 formed on the substrate so as to block the cavity; a two-dimensional piezoelectric material layer 30 formed on the lower protective layer; and an electrode layer 40. Furthermore, as shown in FIG. 2, an upper protective layer 22 formed on the two-dimensional piezoelectric material layer 30 may be further included in the microphone device.

The substrate 10 may further include an insulating layer 11 on the substrate. A through-cavity 50 extends through the substrate 10 and the insulating layer 11. For example, the substrate may be a Si substrate, and the insulating layer may be made of $SiO_2$.

The lower protective layer 21 is formed on the substrate and is disposed to block the cavity 50 defined in the substrate.

The two-dimensional piezoelectric material layer 30 is formed on the lower protective layer. The two-dimensional piezoelectric material layer functions as a diaphragm. An electric potential is generated as the two-dimensional piezoelectric material layer vibrates under sound pressure.

The two-dimensional piezoelectric material layer may be made of any one of a transition metal chalcogenide, an alkaline earth metal oxide, and a group III-V compound. The two-dimensional piezoelectric material layer may be made of the transition metal chalcogenide (TMD) material, and a representative example of the TMD material may include $MoS_2$, $MoSe_2$, $MoTe_2$, $WS_2$, $WSe_2$, $WTe_2$, etc. Alternatively, the two-dimensional piezoelectric material layer may be made of the alkaline earth metal oxide including CdO, ZnO, CaO, MgO, etc., or the group III-V compound including BN, InAs, InP, AlAs, etc.

Furthermore, the two-dimensional piezoelectric material layer may be composed of 1 to 5 layers. When the two-dimensional piezoelectric material layer is composed of multiple layers, the multiple layers may be stacked in an overlapping form. In this case, the number of the layers may be an odd number.

The two-dimensional TMD material layer may have a 1T, 2H, or 3R structure. The 1T structure has metallic properties and thus good conductivity, while the piezoelectric properties and permittivity thereof are somewhat lower. On the contrary, the 2H structure has poor conductivity, while the piezoelectric properties and permittivity thereof are superior to those of the 1T structure. Finally, the 3R structure exhibits better characteristics than those of both the 1T and 2H structures. However, it is difficult for the 3R structure to exist in a natural state. Based on this fact, in the microphone device structure of the present disclosure, the 1T structures and the 2H structures are alternately stacked on top of each other to constitute the two-dimensional piezoelectric material layer such that the characteristics thereof are complemented with each other to improve the dielectric characteristics of the two-dimensional piezoelectric material layer. In another approach, the TMD layer may be doped with niobium (Nb) or layers of two different materials (e.g., $WS_2$, $MoS_2$) may be stacked on top of each other to form the 3R structure showing excellent characteristics. In the multilayer structure, the characteristics of the piezoelectric effect may be additionally improved.

The upper protective layer 22 is disposed on the two-dimensional piezoelectric material layer.

Each of the lower protective layer and the upper protective layer may be made of a material with a similar lattice parameter to that of the two-dimensional piezoelectric material layer, thereby minimizing residual stress. Each of the lower protective layer and the upper protective layer include one of $Al_2O_3$, BN, hBN, $HfO_2$, $SiO_2$, ZnO, and $TiO_2$.

In one example, a thickness of each of the lower protective layer and the upper protective layer may be several hundred nm to 1 μm or smaller.

Furthermore, at least one of the lower protective layer and the upper protective layer may be patterned into a mesh structure. When using the protective layer patterned into such a mesh structure, an advantage of being able to induce a larger strain of the two-dimensional piezoelectric material layer (membrane) may be achieved. That is, when the TMD material is grown and formed on the mesh structure, the piezoelectric effect may be increased.

An electrode layer 40 may be formed on the two-dimensional piezoelectric material layer. Alternatively, when the upper protective layer is present, the electrode layer 40 may be formed on the upper protective layer. The electrode layer may be made of a material that may be used as an electrode material, and there are no special restrictions thereto.

Figure 3:
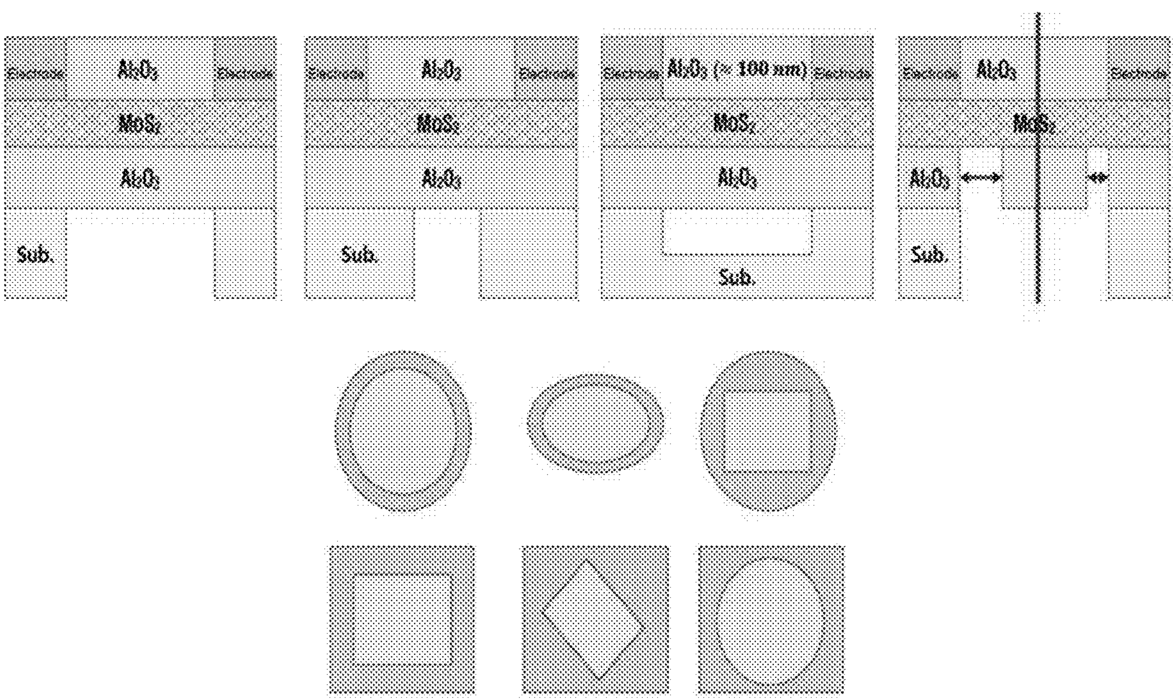
FIG. 3 shows various cavity shapes (hole shapes) and groove sizes, and shows arrangements (upper drawings) of the components, and hole shapes (lower drawings) of the two-dimensional piezoelectric material-based microphone device.

The through-cavity 50 may be a circular cavity, because the circular shape may prevent stress concentration. FIG. 3 shows various cavity shapes (hole shapes) and groove sizes, and shows arrangements (upper drawings) of the components, and hole shapes (lower drawings) of the two-dimensional piezoelectric material-based microphone device. As shown in FIG. 3, various hole-shape defined and groove-shape defined substrates may be used, and a combination of the hole shape and the groove shape may be used. A wider frequency range may be detected by controlling the shape, the size, and the position of the hole.

Figure 4:
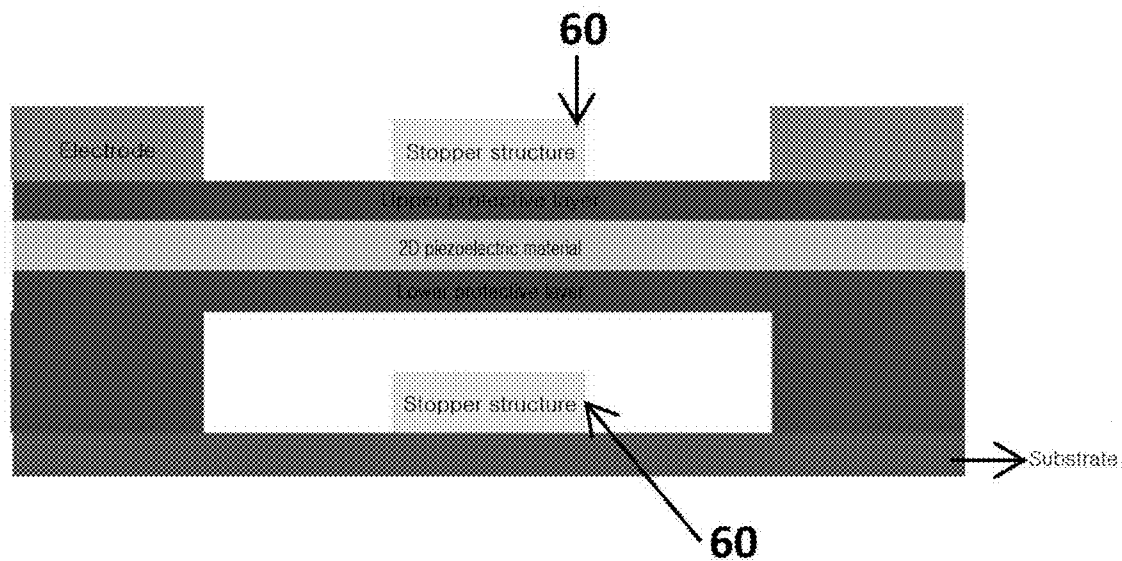
FIG. 4 shows a schematic diagram of a two-dimensional piezoelectric material-based MEMS microphone device in which the stopper structure is formed.

In addition, an additional substrate blocking the cavity space may be disposed under the cavity space. A lower stopper 60 disposed on the additional substrate may be further included in the microphone device structure. Further, an upper stopper 60 disposed on the upper protective layer may be further included in the microphone device structure. FIG. 4 shows a schematic diagram of a two-dimensional piezoelectric material-based MEMS microphone device in which the stopper structure is formed. When the upper stopper and the lower stopper are formed as shown in FIG. 4, the sagging caused by the residual stress generated when the two-dimensional piezoelectric material layer vibrates may be suppressed. This stopper structure may be made of, for example, an elastomer-based material.

FIGS. 5A to 5G illustrate a process diagram of a method for manufacturing a microphone device based on a two-dimensional piezoelectric material layer having a protective layer formed thereon according to an embodiment of the present disclosure. FIG. 6 illustrates a flowchart of a method for manufacturing a microphone device based on a two-dimensional piezoelectric material layer having a protective layer formed thereon according to an embodiment of the present disclosure.

As illustrated in FIGS. 5A to 5G, a method for manufacturing a microphone device based on a two-dimensional piezoelectric material layer having a protective layer formed thereon according to an embodiment of the present disclosure includes a step of preparing a substrate in S 110; a step of forming a lower protective layer on the substrate in S 120; a step of forming a two-dimensional piezoelectric material layer on the lower protective layer in S 130; a step of forming an upper protective layer on the two-dimensional piezoelectric material layer in S 140; a step of forming an electrode layer in S 150; and a step of etching an opposite surface to a surface of the substrate on which the two-dimensional piezoelectric material layer has been formed in S 160.

In S 110, the substrate is prepared, and an insulating layer 11 may be additionally formed on the substrate 10. For example, a Si substrate may be used as the substrate, and the insulating layer may be made of $SiO_2$.

Figure 5A:
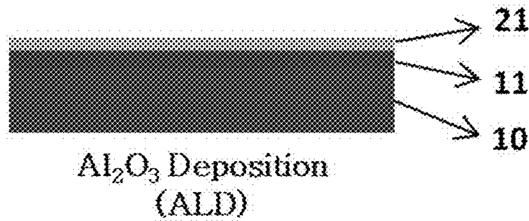
FIGS. 5A to 5G illustrate a process diagram of a method for manufacturing a microphone device based on a two-dimensional piezoelectric material layer having a protective layer formed thereon according to an embodiment of the present disclosure.
Figure 6:
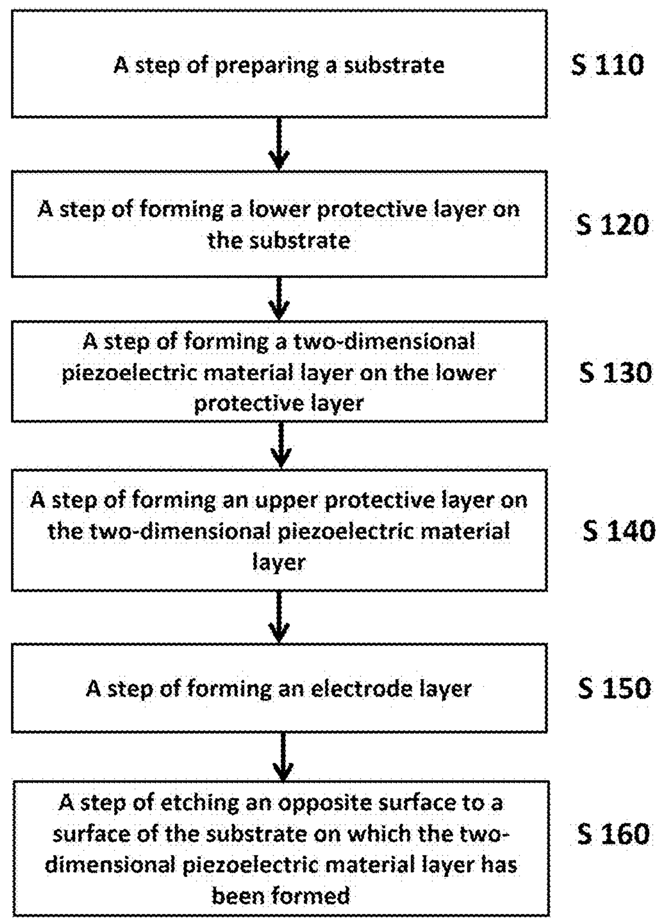
FIG. 6 illustrates a flowchart of a method for manufacturing a microphone device based on a two-dimensional piezoelectric material layer having a protective layer formed thereon according to an embodiment of the present disclosure.

In S 120, the lower protective layer 21 is formed on the substrate as shown in FIG. 5A. The lower protective layer may be formed using atomic layer deposition (ALD).

Figure 5B:
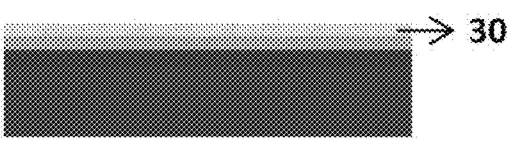

In S 130, the two-dimensional piezoelectric material layer 30 is formed on the lower protective layer as shown in FIG. 5B. The two-dimensional piezoelectric material layer may be made of one of transition metal chalcogenides, alkaline earth metal oxides, and group III-V compounds. The two-dimensional piezoelectric material layer may be formed using sputtering and thermal treatment. Furthermore, the two-dimensional piezoelectric material layer may be composed of 1 to 5 layers.

Figure 5C:
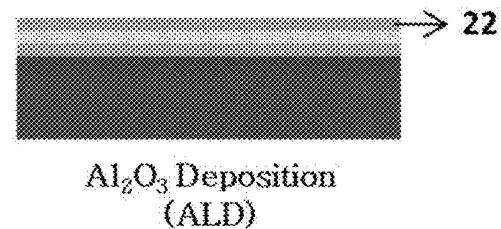

In S 140, the upper protective layer 22 is formed on the two-dimensional piezoelectric material layer as shown in FIG. 5C. The upper protective layer may be formed using atomic layer deposition (ALD).

Figure 5D:
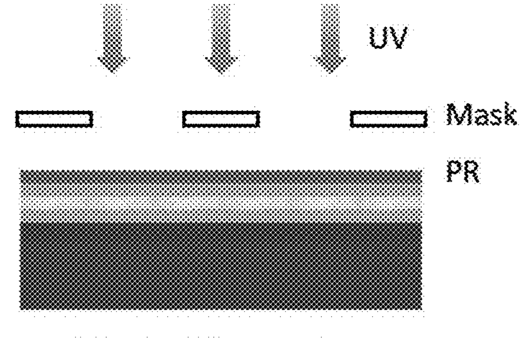
Figure 5E:
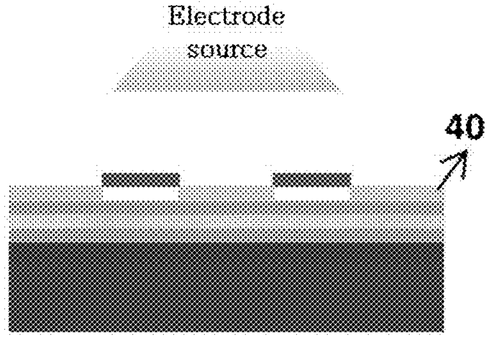

In S 150, the electrode 40 is formed on the upper protective layer, and the electrode formation process is illustrated in FIGS. 5D to 5E. For example, the electrode layer is formed using photolithography and E-beam evaporation.

Figure 5F:
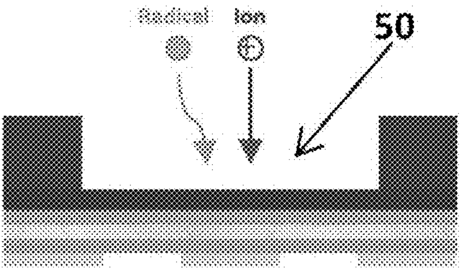

In S 160, a process of etching the opposite surface to the surface of the substrate on which the two-dimensional piezoelectric material layer has been formed is performed. The opposite surface to the surface of the substrate on which the two-dimensional material layer has been formed is etched such that the cavity 50 vertically extending through the substrate is formed. This is illustrated in FIG. 5F. This etching process may be performed using, for example, deep RIE (Reactive Ion Etching) or dry etching.

Figure 5G:

FIG. 5G illustrates a structural diagram of a resulting microphone device.

Each of the lower protective layer and the upper protective layer may be made of a material having a similar lattice parameter to that of the two-dimensional piezoelectric material layer, and each of the lower protective layer and the upper protective layer may include one of $Al_2O_3$, BN, hBN, $HfO_2$, $SiO_2$, ZnO, and $TiO_2$. Furthermore, at least one of the lower protective layer and the upper protective layer may be patterned into a mesh structure.

EXAMPLE 1

In Example 1, the microphone device based on a two-dimensional piezoelectric material layer having the upper and lower protective layer formed thereon was manufactured. $MoS_2$ was used as the two-dimensional piezoelectric material, and $Al_2O_3$ was used as the material of each of the upper and lower protective layers.

An $Al_2O_3$ lower protective layer was formed on a $SiO_2$ substrate using an atomic layer deposition (ALD) scheme, and then $MoS_2$ was synthesized (sulfurized) on the $Al_2O_3$ lower protective layer via Mo sputtering and then, thermal treatment thereof in a hydrogen sulfide atmosphere. Thereafter, an $Al_2O_3$ upper protective layer was formed on $MoS_2$ using the ALD scheme. A mask was formed and patterned on the $MoS_2$ surface using a photolithography process, and electrode deposition and lift-off were performed on the $MoS_2$ surface using sputtering or evaporation (E-beam) equipment. Thereafter, a hole patterning was performed on a back side of the Si substrate to form the through-cavity. In this regard, back-side hole pattern etching was performed using dry etching. Finally, $SiO_2$ was etched using HF vapor.

Figure 7:
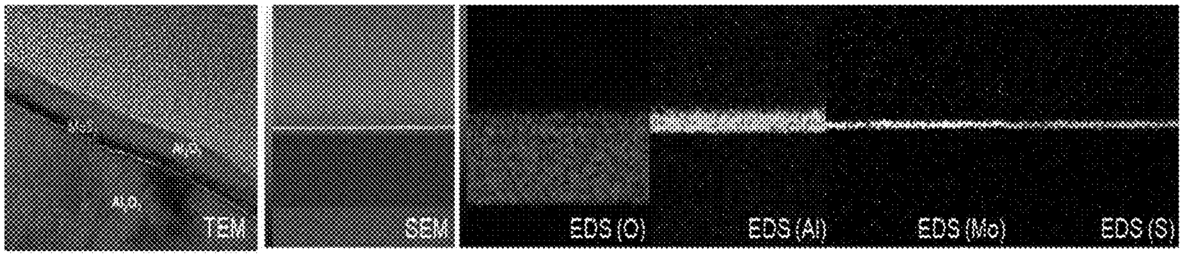
FIG. 7 show images identifying the $Al_2O_3$ upper and lower protective layers respectively formed on upper and lower surfaces of the $MoS_2$ two-dimensional piezoelectric material. The left side is a TEM image, and the right side shows SEM EDS analysis (O, Al, Mo, S).

FIG. 7 show images identifying the $Al_2O_3$ upper and lower protective layers respectively formed on upper and lower surfaces of the $MoS_2$ two-dimensional piezoelectric material. The left side is a TEM image, and the right side shows SEM EDS analysis (O, Al, Mo, S).

2. MEMS Microphone Device Having Surface Structures Formed Via Surface Patterning on and/or in Lower Protective Layer or Substrate The MEMS microphone device based on the two-dimensional piezoelectric material layer having the upper and lower protective layers formed thereon described above in which surface structures are formed through surface patterning on and/or in the lower protective layer or substrate will be described. In the present disclosure, the surface structures are formed via surface patterning on and/or in the lower protective layer and then, the two-dimensional piezoelectric material layer is synthesized thereon, thereby enabling detection of a high-frequency range such as ultrasound.

Figure 8:
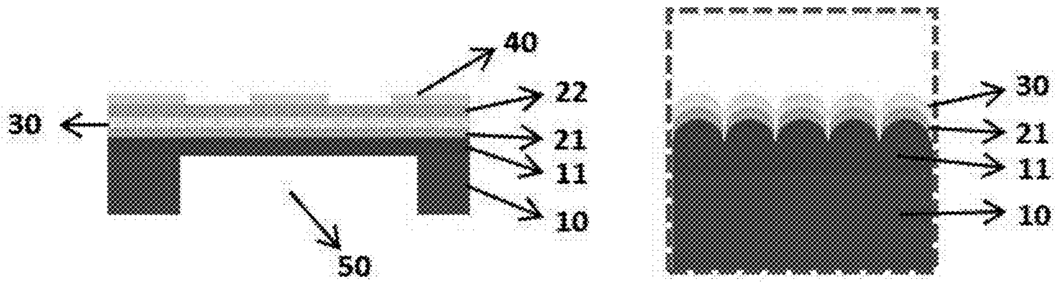
FIG. 8 is a cross-sectional view and an enlarged view showing a structure of a microphone device capable of detecting a high frequency range using the surface patterning of the lower protective layer according to an embodiment of the present disclosure.

FIG. 8 is a cross-sectional view and an enlarged view showing a structure of a microphone device capable of detecting a high frequency range using the surface patterning of the lower protective layer according to an embodiment of the present disclosure.

As shown in the enlarged view of FIG. 8, in the present disclosure, multiple structures, each having an upwardly gradually narrower shape are arranged in and/or on the lower protective layer. Thus, the two-dimensional piezoelectric material layer has a structure conforming to the multiple structures, each having an upwardly gradually narrower shape, of the lower protective layer. As shown in FIG. 8, the lower protective layer is formed on the insulting layer on the substate such that the multiple structures, each having an upwardly gradually narrower shape, are arranged in and/or on the lower protective layer. The two-dimensional piezoelectric material layer has a structure conforming to the multiple structures, each having an upwardly gradually narrower shape, of the lower protective layer.

Figure 15:
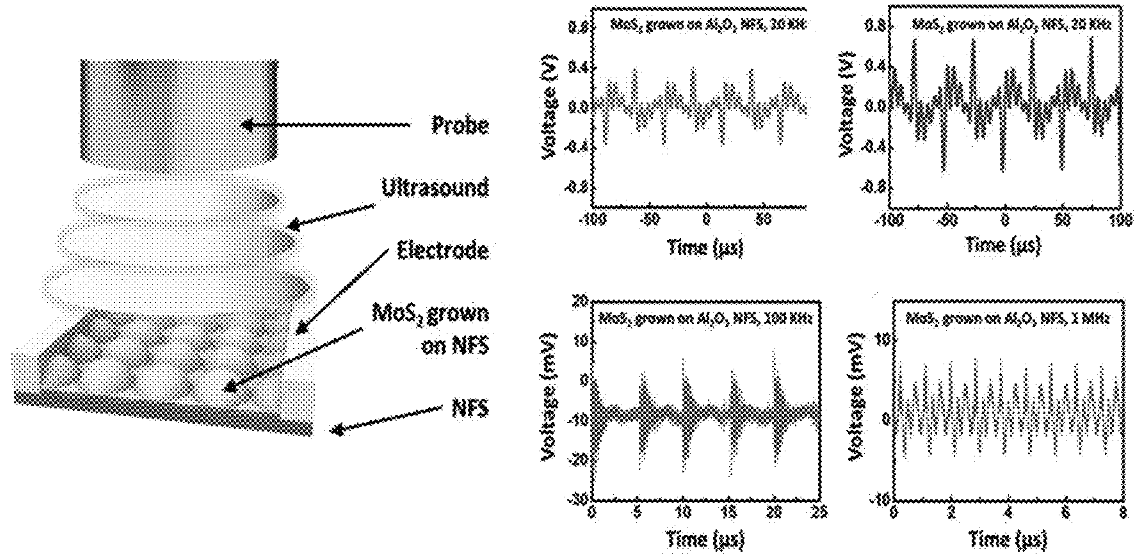
FIG. 15 shows the analysis of the ultrasonic energy harvesting characteristics of the nano-island-lower protective layer-based microphone device under ultrasonic waves.

In this regard, the structure having the upwardly gradually narrower shape may be embodied as a hemispherical circular structure as shown in FIG. 8 and FIG. 15. The structure having the upwardly gradually narrower shape may have a circular shape in a plan view. This is merely an example. That is, the structure having the upwardly gradually narrower shape may be embodied as a cone or a pyramid. This structure may be named as a 'nano-island' by way of example.

A plurality of the structures, each having the upwardly gradually narrower shape, may be are arranged, and preferably, may be spaced from each other by an equal spacing. The surface structures may be synthesized in synthesizing the lower protective layer, or the surface structures may be pre-formed on the substrate and the lower protective layer may be synthesized thereon in a conformal manner thereto. Alternatively, the surface structures may be additionally synthesized on the lower protective layer. However, the present disclosure is not limited thereto.

The surface structures may be formed on and/or in the lower protective layer and then, the two-dimensional piezoelectric material layer may be formed on the surface structures in the conformal manner thereto. Thus, the high-frequency range such as ultrasound may be detected by the microphone device. When the two-dimensional piezoelectric material is synthesized on the lower protective layer on and/or in which the surface structures are formed, a strain is applied to the two-dimensional piezoelectric material due to the surface structures. In this regard, the strain applied to the two-dimensional piezoelectric material is called the 'pre-strain' effect. The piezoelectric properties may be further maximized via control of the number of layers and coupling effect.

Furthermore, the surface structures of the upwardly gradually narrower shape may be formed not only on and/or in the lower protective layer but also on and/or in the substrate. The multiple surface structures of the upwardly gradually narrower shape are formed on and/or in the substrate, such that the lower protective layer and the two-dimensional piezoelectric material layer on the lower protective layer may have the surface structures of the upwardly gradually narrower shape conforming to the surface structures of the substrate.

Figure 9:
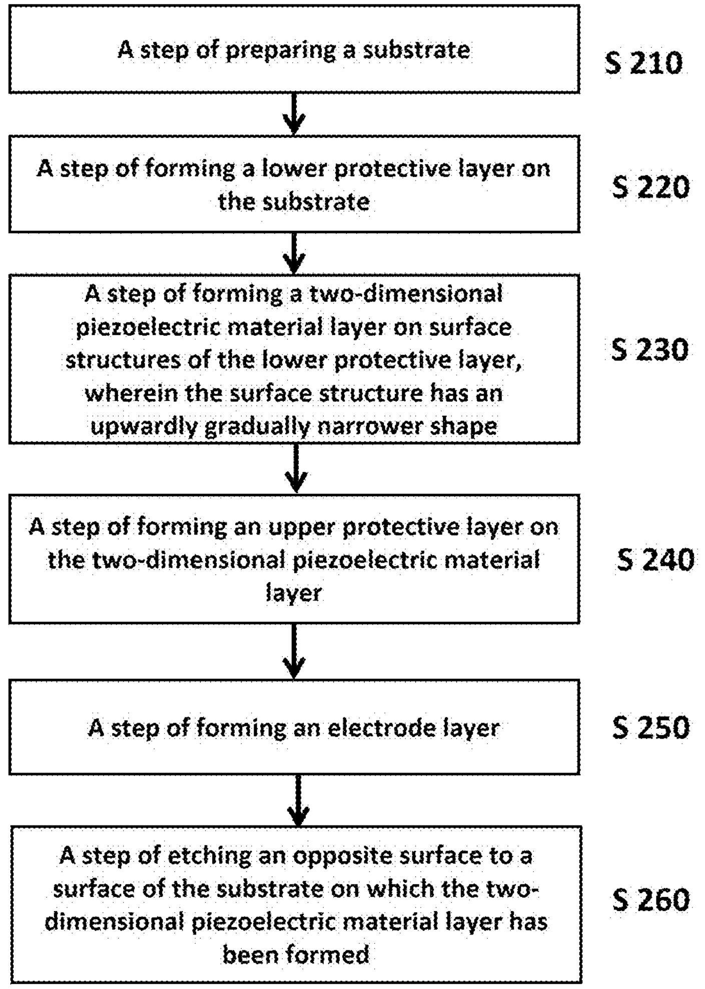
FIG. 9 illustrates a flow chart of a method for manufacturing a microphone device capable of high-frequency detection using the surface patterning on and/or in the lower protective layer or the substrate according to one embodiment of the present disclosure.

FIG. 9 illustrates a flow chart of a method for manufacturing a microphone device capable of high-frequency detection using the surface patterning on and/or in the lower protective layer or the substrate according to one embodiment of the present disclosure. FIGS. 10A to 10G illustrate a process diagram of a method for manufacturing a microphone device capable of detecting the high-frequency range using the surface patterning on and/or in a lower protective layer or the substrate according to an embodiment of the present disclosure.

In S 210, the substrate is prepared, and an insulating layer 11 may be additionally formed on the substrate 10. For example, a Si substrate may be used as the substrate, and the insulating layer may be made of $SiO_2$.

Figure 10A:
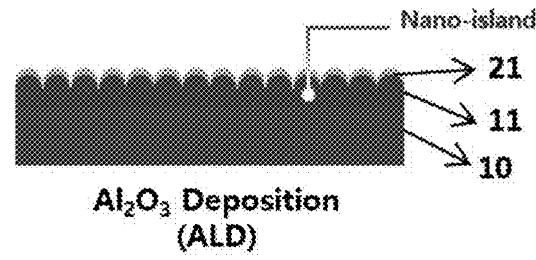
FIGS. 10A to 10G illustrate a process diagram of a method for manufacturing a microphone device capable of detecting the high-frequency range using the surface patterning on and/or in a lower protective layer or the substrate according to an embodiment of the present disclosure.

In S 220, the lower protective layer 21 is formed on the substrate as shown in FIG. 10A. The lower protective layer may be formed using atomic layer deposition (ALD). As shown in FIG. 10A, the lower protective layer is formed on the insulting layer on the substate such that the multiple structures, each having an upwardly gradually narrower shape, are arranged in and/or on the lower protective layer. The two-dimensional piezoelectric material layer has a structure conforming to the multiple structures, each having an upwardly gradually narrower shape, of the lower protective layer. In this regard, the structure having the upwardly gradually narrower shape may be embodied as a hemispherical circular structure as shown in 10A. The structure having the upwardly gradually narrower shape may have a circular shape in a plan view. This is merely an example. That is, the structure having the upwardly gradually narrower shape may be embodied as a cone or a pyramid. This structure may be named as a 'nano-island' by way of example. A plurality of the structures, each having the upwardly gradually narrower shape, may be are arranged, and preferably, may be spaced from each other by an equal spacing. The surface structures may be synthesized in synthesizing the lower protective layer, or the surface structures may be pre-formed on the substrate and the lower protective layer may be synthesized thereon in a conformal manner thereto. Alternatively, the surface structures may be additionally synthesized on the lower protective layer. However, the present disclosure is not limited thereto. The surface structures may be formed on and/or in the lower protective layer and then, the two-dimensional piezoelectric material layer may be formed on the surface structures in the conformal manner thereto. Thus, the high-frequency range such as ultrasound may be detected by the microphone device. When the two-dimensional piezoelectric material is synthesized on the lower protective layer on and/or in which the surface structures are formed, a strain is applied to the two-dimensional piezoelectric material due to the surface structures. In this regard, the strain applied to the two-dimensional piezoelectric material is called the 'pre-strain' effect. The piezoelectric properties may be further maximized via control of the number of layers and coupling effect.

Figure 10B:

In S 230, the two-dimensional piezoelectric material layer 30 is formed on the lower protective layer as shown in FIG. 10B. The two-dimensional piezoelectric material layer may be made of one of transition metal chalcogenides, alkaline earth metal oxides, and group III-V compounds. The two-dimensional piezoelectric material layer may be formed using sputtering and thermal treatment. Furthermore, the two-dimensional piezoelectric material layer may be composed of 1 to 5 layers.

Figure 10C:
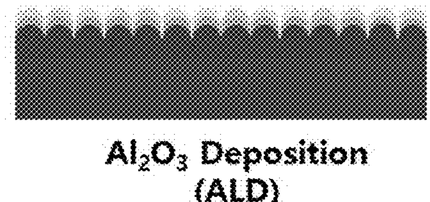

In S 240, the upper protective layer 22 is formed on the two-dimensional piezoelectric material layer as shown in FIG. 10C. The upper protective layer may be formed using atomic layer deposition (ALD). This upper protective layer is optional and may be omitted. When the upper and lower protective layers are respectively formed on the upper and lower surfaces of the two-dimensional piezoelectric material layer, mechanical stability of the microphone device may be improved, and the microphone device may be protected from the external environment.

Figure 10D:
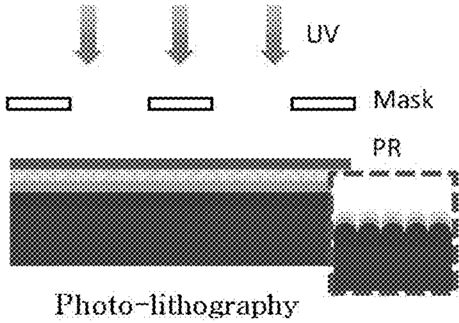
Figure 10E:
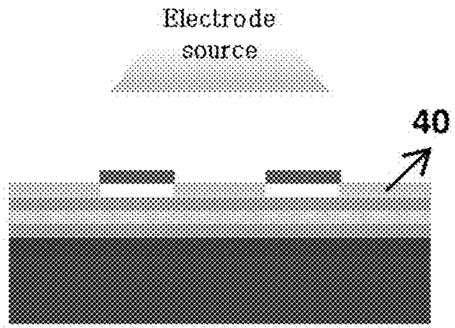

In S 250, the electrode 40 is formed on the upper protective layer, and the electrode formation process is illustrated in FIGS. 10D to 10E. For example, the electrode layer is formed using photolithography and E-beam evaporation.

Figure 10F:
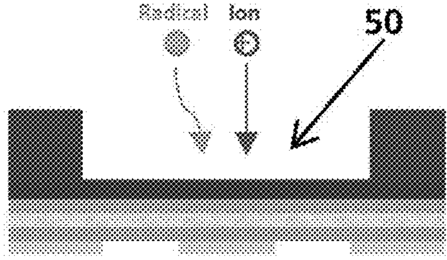
Figure 10G:
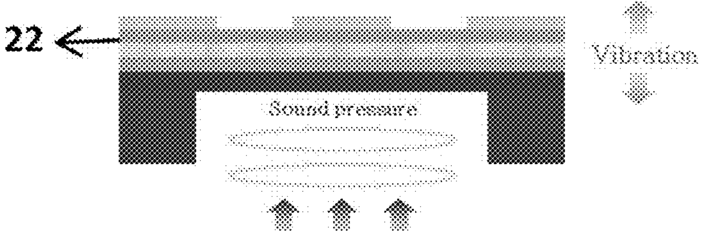

In S 260, a process of etching the opposite surface to the surface of the substrate on which the two-dimensional piezoelectric material layer has been formed is performed. The opposite surface to the surface of the substrate on which the two-dimensional material layer has been formed is etched such that the cavity 50 vertically extending through the substrate is formed. This is illustrated in FIG. 10F. This etching process may be performed using, for example, deep RIE (Reactive Ion Etching) or dry etching.

EXAMPLE 2

In Example 2, the microphone device based on a two-dimensional piezoelectric material layer having the upper and lower protective layer formed thereon was manufactured. $MoS_2$ was used as the two-dimensional piezoelectric material, and $Al_2O_3$ was used as the material of each of the upper and lower protective layers.

A plurality of hemispherical surface structures were formed on the $SiO_2$ substrate using an atomic layer deposition (ALD) scheme and then the $Al_2O_3$ lower protective layer was formed on the $SiO_2$ substrate in the conformal manner to the plurality of hemispherical surface structures. Then, $MoS_2$ was synthesized (sulfurized) on $Al_2O_3$ lower protective layer via Mo sputtering and then, thermal treatment thereof in a hydrogen sulfide atmosphere. Thereafter, an $Al_2O_3$ upper protective layer was formed on $MoS_2$ using the ALD scheme. A mask was formed and patterned on the $MoS_2$ surface using a photolithography process, and electrode deposition and lift-off were performed on the $MoS_2$ surface using sputtering or evaporation (E-beam) equipment. Thereafter, a hole patterning was performed on a back side of the Si substrate to form the through-cavity. In this regard, back-side hole pattern etching was performed using dry etching. Finally, $SiO_2$ was etched using HF vapor.

Figure 11:
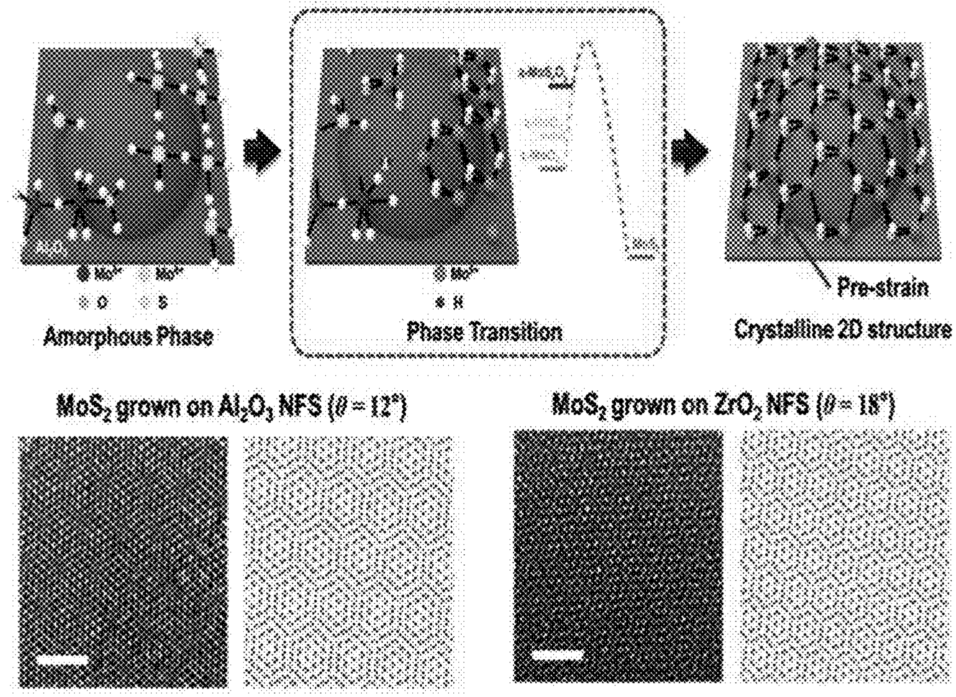
FIG. 11 shows a schematic diagram of the pre-strain effect and shows a twisted angle of the $MoS_2$ 2 layers based on types ($Al_2O_3$ and $ZrO_2$) of the nano-island-lower protective layer.

FIG. 11 shows a schematic diagram of the pre-strain effect and shows a twisted angle of the $MoS_2$ 2 layers based on types ($Al_2O_3$ and $ZrO_2$) of the nano-island-lower protective layer. The pre-strain applied in synthesizing the two-dimensional piezoelectric material layer on the nano-island-lower protective layer is schematically shown in FIG. 11. The TEM image shows the twisted angle of the $MoS_2$ 2 layers made of $MoS_2$ as one of the representative two-dimensional piezoelectric materials, based on types ($Al_2O_3$ and $ZrO_2$) of the nano-island-lower protective layer. When $Al_2O_3$ was used, a size of the nano-island was larger than a size of the nano-island when $ZrO_2$ was used. The smaller the nano-island size, the larger the twisted angle of the $MoS_2$ layers tended to be.

Figure 12:
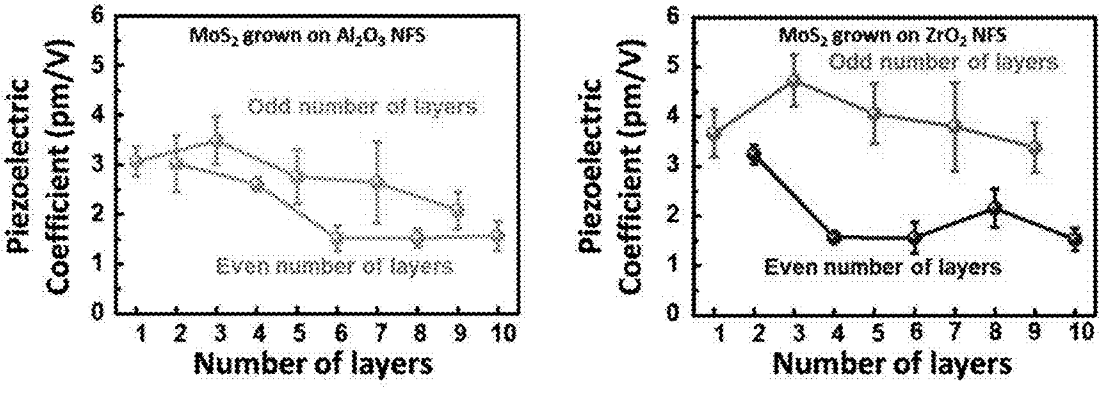
FIG. 12 shows the piezoelectric characteristics of $MoS_2$ synthesized on the $Al_2O_3$(left) or $ZrO_2$ (right) nano-island-lower protective layer.

According to previous research results, in the case of 2H-$MoS_2$, when the number of layers is odd, the monolayer has the best piezoelectric properties, while the number of layers is even, the polarization directions are cancelled from each other, so the piezoelectric properties are not observed. FIG. 12 shows a $d_{11}$ value of $MoS_2$ synthesized on the nano-island-lower protective layer. Unlike the previous results, in both $Al_2O_3$ and $ZrO_2$, the highest di value was obtained when the number of layers was 3, while the $d_{11}$ value was obtained when the number of layers was even. This is due to the "pre-strain" effect and "non-2H stacking" due to the nano-island structure. Based on a comparing result of $MoS_2$ grown on the nano-island and $MoS_2$ grown on a flat surface, it was identified that a larger $d_{11}$ value was obtained due to the Pre-strain effect when $MoS_2$ was grown on the nano-island than that when $MoS_2$ was grown on the flat surface. In addition, the stresses respectively applied to the $MoS_2$ layers were different from each other. In this regard, when the van der Waals force between the $MoS_2$ layers cancels the stress. Thus, non-2H stacking disappeared when the number of layers reached a predefined number.

Figure 13:
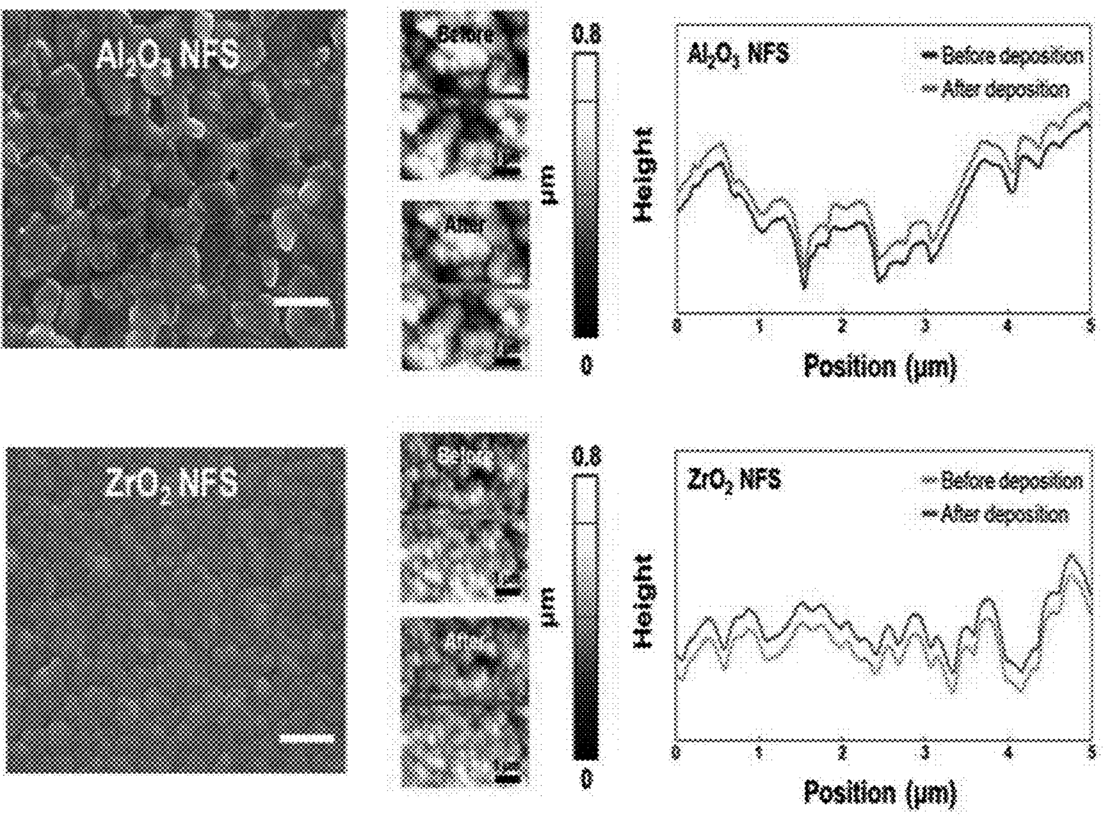
FIG. 13 shows the surface morphology analysis before and after the synthesis of $MoS_2$ on the nano-island-lower protective layer.

FIG. 13 shows the uniform growth of $MoS_2$ on the nano-island-lower protective layer. Based on a comparing result of the surface morphologies before and after the growth, it was identified that $MoS_2$ grew along the surface morphology.

Figure 14:
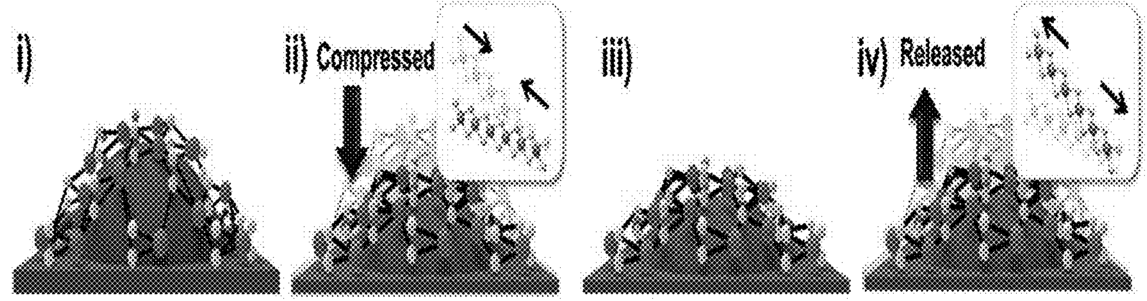
FIG. 14 is a schematic diagram showing the behavior of the two-dimensional piezoelectric material formed on a single nano-island structure when ultrasonic waves are applied thereto.

FIG. 14 is a schematic diagram showing the behavior of the two-dimensional piezoelectric material formed on a single nano-island structure when ultrasonic waves are applied thereto. This shows that $MoS_2$ is deformed in both the horizontal and vertical directions while the nano-island structure is repeatedly compressed/released. FIG. 15 shows a schematic diagram of an operation of the nano-island-lower protective layer-based microphone device under ultrasonic waves and an output thereof under different ultrasonic frequencies.

An example in which the surface structure is embodied as the hemispherical nano-island has been described. However, various surface structures may be applied to the lower protective layer to detect various frequencies.

3. MEMS Microphone Device Capable of Detecting Two Piezoelectric Characteristics Using Upper and Lower Electrodes The MEMS microphone device as described above capable of detecting two piezoelectric characteristics using upper and lower electrodes will be described. In the MEMS microphone device as described above, the suspended $MoS_2$ (or TMD material) exhibits piezoelectric characteristics in the $d_{11}$ direction. Thus, the electrodes are arranged in the horizontal direction. In addition, in order to further increase the sensitivity of the microphone device, it is necessary for the device to have piezoelectric characteristics in the $d_{33}$ direction as well as the $d_{11}$ direction. To this end, the present disclosure additionally discloses a microphone device capable of detecting two piezoelectric characteristics using upper and lower electrodes. Specifically, vertically arranged electrodes (an upper electrode and a lower electrode) may be additionally arranged vertically in addition to horizontally arranged electrodes, such that the microphone device capable of detecting both piezoelectric characteristics in the $d^{11}$ direction and the $d_{33}$ direction is provided.

Figure 16:
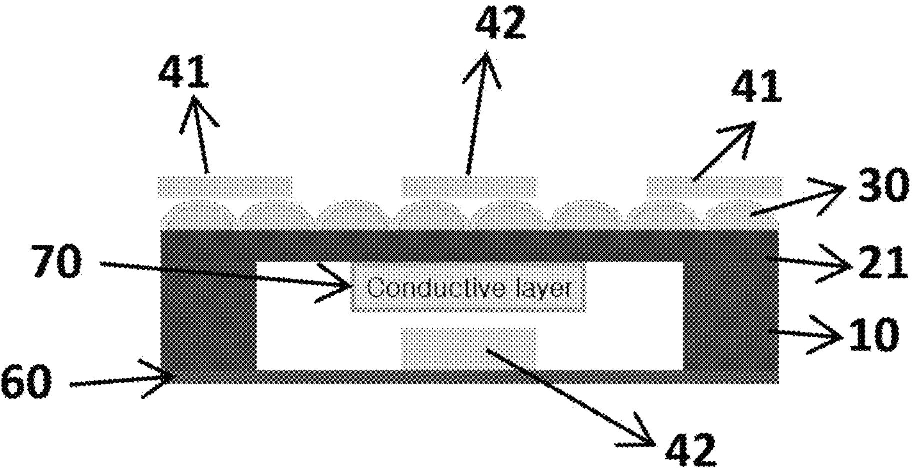
FIG. 16 shows a cross-sectional view of a microphone device capable of detecting two piezoelectric characteristics using upper and lower electrodes according to one embodiment of the present disclosure.

As illustrated in FIG. 16, the microphone device capable of detecting two piezoelectric characteristics using the upper and lower electrodes according to one embodiment of the present disclosure includes: a substrate 10 including a cavity 50 vertically extending therethrough; a lower protective layer 21 formed on an upper surface of the substrate so as to block the cavity; a two-dimensional piezoelectric material layer 30 formed on the lower protective layer; two or more horizontally-arranged electrodes 41 disposed on the two-dimensional piezoelectric material layer arranged in the horizontal direction and spaced from each other; an upper electrode 42 disposed between adjacent one of the two or more horizontally-arranged electrodes; a packaging layer 60 disposed on a lower surface of the substate so as to block the cavity vertically extending through the substrate; and a lower electrode 42 disposed on an upper surface of the packaging layer. For convenience of descriptions, a pairs of electrodes arranged horizontally are referred to the horizontally-arranged electrodes, and a pairs of electrodes arranged vertically are referred to as vertically-arranged electrodes.

Figure 17:
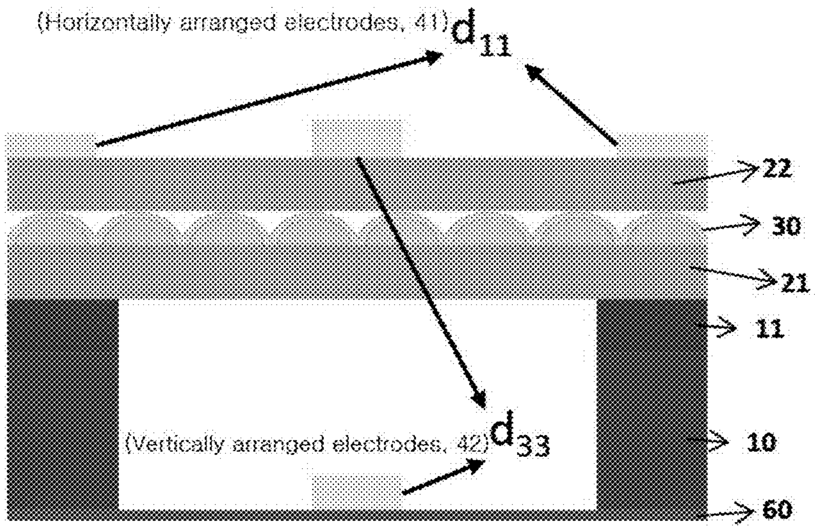
FIG. 17 is a cross-sectional view showing a structure of a microphone device capable of detecting two piezoelectric characteristics using upper and lower electrodes according to an additional embodiment of the present disclosure.
Figure 18:
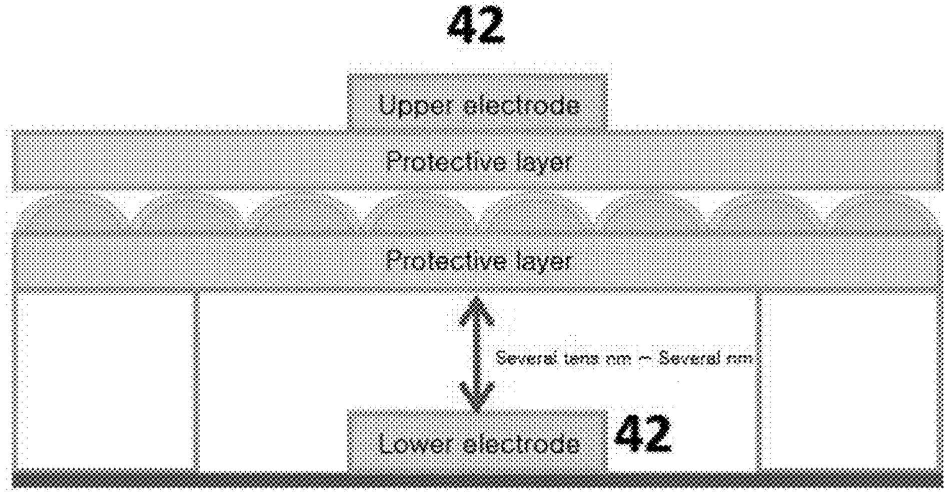
FIG. 18 is a schematic diagram of a microphone device capable of detecting the piezoelectric characteristics in the $d_{33}$ direction using a piezoelectric material layer in a form of a pre-strain thin film and upper and lower electrodes.

Furthermore, as shown in FIG. 17, the upper protective layer 22 formed on the two-dimensional piezoelectric material layer may be further included in the device. When the device further includes the upper protective layer 22, the horizontally-arranged electrodes and the upper electrode may be disposed on the upper protective layer.

As shown in FIG. 16, in accordance with the present disclosure, a plurality of surface structures, each having an upwardly gradually narrower shape, are disposed and arranged in and/or on in the lower protective layer. The two-dimensional piezoelectric material layer is formed on the plurality of surface structures of the lower protective layer in a conformal manner to the plurality of surface structures of the lower protective layer.

Alternatively, a plurality of surface structures, each having an upwardly gradually narrower shape, are disposed and arranged on the substrate, wherein the lower protective layer is formed on the plurality of surface structures of the substrate in a conformal manner to the plurality of surface structures of the substrate, wherein the two-dimensional piezoelectric material layer is formed on the lower protective layer in a conformal manner to the plurality of surface structures of the substrate.

The horizontally-arranged electrodes 41 may be disposed on the two-dimensional piezoelectric material layer or on the upper protective layer, and may be spaced apart from each other, and may be arranged in the horizontal direction.

Furthermore, in accordance with the present disclosure, an upper electrode 42 disposed between adjacent ones of the two or more horizontally-arranged electrodes is further included in the device.

Furthermore, in accordance with the present disclosure, the packaging layer 60 may be disposed on a lower surface of the substrate so as to cover the cavity, and a lower electrode 42 may be disposed on an upper surface of the packaging layer. The lower electrode 42 and the upper electrode 42 may overlap each other vertically. The cavity 50 may be blocked with the packaging layer 60, and the lower electrode 42 may be disposed on the upper surface of this packaging layer. The packaging layer may be made of a substrate material or a protective layer material, and may include, for example, a material such as $SiO_2$ or $Al_2O_3$.

In one example, in accordance with the present disclosure, the upper electrode and the lower electrode overlap each other in the vertical direction. In this case, the piezoelectric characteristic in the $d_{33}$ direction may be detected more efficiently. In this case, as shown in FIG. 4, a spacing between each of the upper and lower electrodes and the piezoelectric material layer may be in a wide range from several tens of nm to several μm in consideration of the deformation of the piezoelectric material layer.

The through-cavity 50 may have a circular shape in the plan view, because the circular shape may prevent stress concentration.

Figure 19:
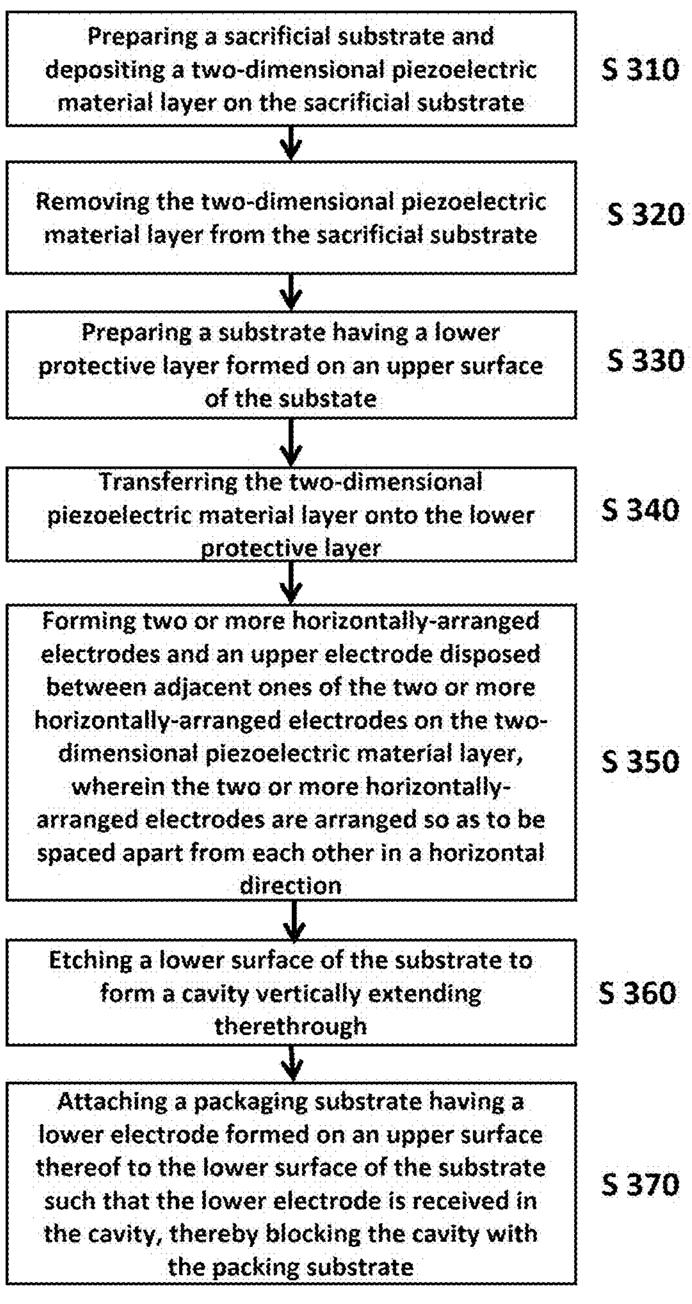
FIG. 19 is a flow chart of a method for manufacturing a microphone device capable of detecting two piezoelectric characteristics using the upper and lower electrodes according to an embodiment of the present disclosure.

Furthermore, as shown in FIG. 16 of the present disclosure, a conductive layer 70 attached to the lower surface of the lower protective layer and received in the cavity space may be further included in the microphone device. The conductive layer made of Mo, Cu, Al, Ag, Au, etc. may be deposited such that the sensing sensitivity of the low-frequency band may be additionally improved FIG. 19 illustrates a flow chart of a method for manufacturing a microphone device capable of detecting two piezoelectric characteristics using the upper and lower electrodes according to one embodiment of the present disclosure. FIGS. 20A to 20G illustrate process diagrams of a method for manufacturing a microphone device capable of detecting two piezoelectric characteristics using the upper and lower electrodes according to one embodiment of the present disclosure.

A method for manufacturing a microphone device capable of detecting two piezoelectric characteristics using upper and lower electrodes according to an embodiment of the present disclosure includes preparing a sacrificial substrate and depositing a two-dimensional piezoelectric material layer on the sacrificial substrate in S 310; removing the two-dimensional piezoelectric material layer from the sacrificial substrate in S 320; preparing a substrate having a lower protective layer formed on an upper surface of the substate in S 330; transferring the two-dimensional piezoelectric material layer onto the lower protective layer in S 340; forming two or more horizontally-arranged electrodes and an upper electrode disposed between adjacent ones of the two or more horizontally-arranged electrodes on the two-dimensional piezoelectric material layer, wherein the two or more horizontally-arranged electrodes are arranged so as to be spaced apart from each other in a horizontal direction in S 350; etching a lower surface of the substrate to form a cavity vertically extending therethrough in S 360; and attaching a packaging substrate having a lower electrode formed on an upper surface thereof to the lower surface of the substrate such that the lower electrode is received in the cavity, thereby blocking the cavity with the packing substrate in S370.

Figure 20A:
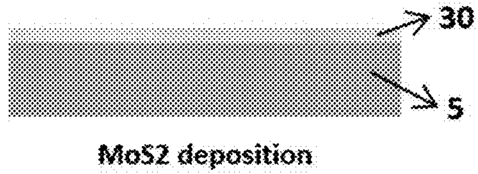
FIGS. 20A to 20G are process diagrams of a method for manufacturing a microphone device capable of detecting two piezoelectric characteristics using upper and lower electrodes according to an embodiment of the present disclosure.

In S 310, a sacrificial substrate is prepared as shown in FIG. 20A, and a two-dimensional piezoelectric material layer is deposited on the sacrificial substrate. In this case, the two-dimensional piezoelectric material layer may be deposited using sputtering or a CVD scheme.

Figure 20B:

In S 320, the two-dimensional piezoelectric material layer is removed from the sacrificial substrate using an acid etching scheme as shown in FIG. 20B.

In S 330, a substrate having a lower protective layer formed on an upper surface of is prepared. The lower protective layer may be formed using atomic layer deposition (ALD).

Figure 20C:

In S 340, the two-dimensional piezoelectric material layer prepared in S 320 is transferred onto the lower protective layer as shown in FIG. 20C. This transfer may be performed in a wet transfer scheme.

Figure 20D:
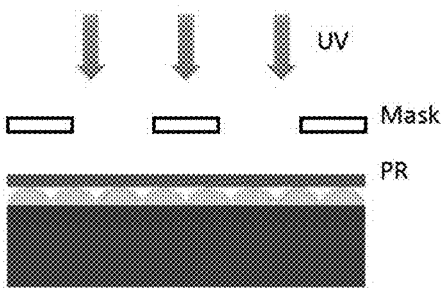
Figure 20E:
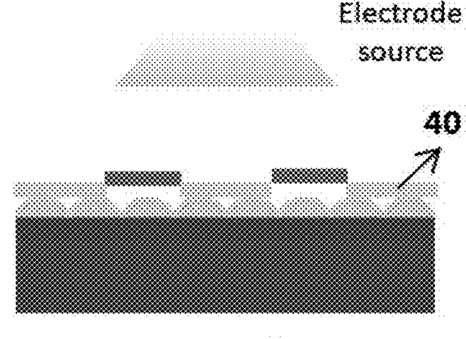

In S 350, the electrodes are formed as shown in FIG. 20D to FIG. 20E. For example, an electrode layer is formed via photolithography and E-beam evaporation.

Figure 20F:
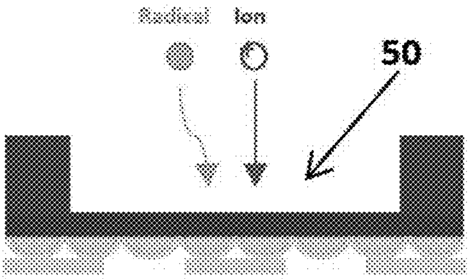
Figure 20G:
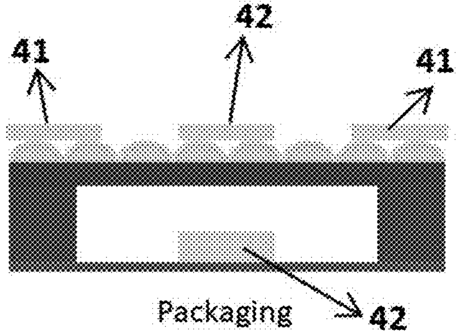

In S 360, a cavity vertically extending through the substrate is formed by etching the lower surface of the substrate as shown in FIG. 20F.

In this way, a cavity 50 vertically extending therethrough is formed by etching the opposite surface to the surface of the substrate on which the two-dimensional material layer is formed. In other words, the opposite surface to the surface of the substrate on which the two-dimensional material layer has been formed is etched such that the cavity 50 vertically extending through the substrate is formed. This is illustrated in FIG. 20F. This etching process may be performed using, for example, deep RIE (Reactive Ion Etching) or dry etching.

In S 370, a packaging substrate having a lower electrode formed on an upper surface thereof may be attached to the lower surface of the substrate such that the lower electrode is received in the cavity, thereby blocking the cavity with the packing substrate. The substrate material or the protective layer material may be used as a material of the packaging substrate. For example, a material such as $SiO_2$ or $Al_2O_3$ may be used as a material of the packaging substrate.

In one example, after transferring the two-dimensional piezoelectric material layer onto the lower protective layer, forming the upper protective layer on the two-dimensional piezoelectric material layer may be further included in the method. In this case, the horizontally-arranged electrodes and the upper electrode may be formed on the upper protective layer.

Furthermore, a step of attaching the conductive layer to the lower surface of the lower protective layer so as to be received in the cavity space may be further included in the method.

EXAMPLE 3

$MoS_2$ was deposited on an $Al_2O_3$ substrate via sputtering and CVD, and then $MoS_2$ was separated therefrom through HF etching.

$MoS_2$ was transferred on Si/$SiO_2$ patterned in a dome shape in a wet transfer manner and then, the mask were formed and patterned on the $MoS_2$ surface using a photolithography process. Then, horizontally-arranged electrodes and upper electrodes were deposited on the $MoS_2$ surface via an E-beam process. Next, hole patterning and hole pattern etching were performed on the back-side of the substrate to form the cavity. An additional packaging substrate having the lower electrode deposited on the upper surface thereof was attached to the lower surface of the substrate such that the lower electrode is received in the cavity, thereby blocking the cavity.

Figure 21:
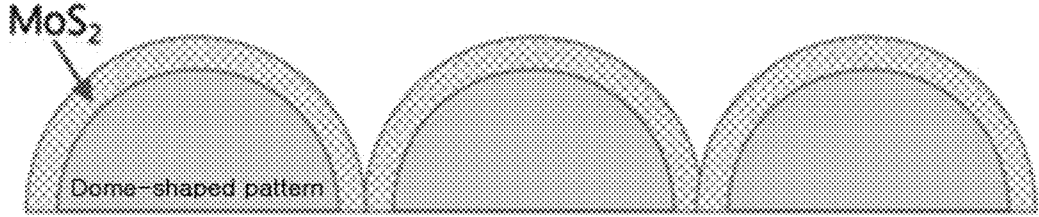
FIG. 21 is a schematic diagram of a two-dimensional piezoelectric material layer formed by transferring $MoS_2$ onto a dome-shaped patterned substrate to form a pre-strain thin film.
Figure 22:
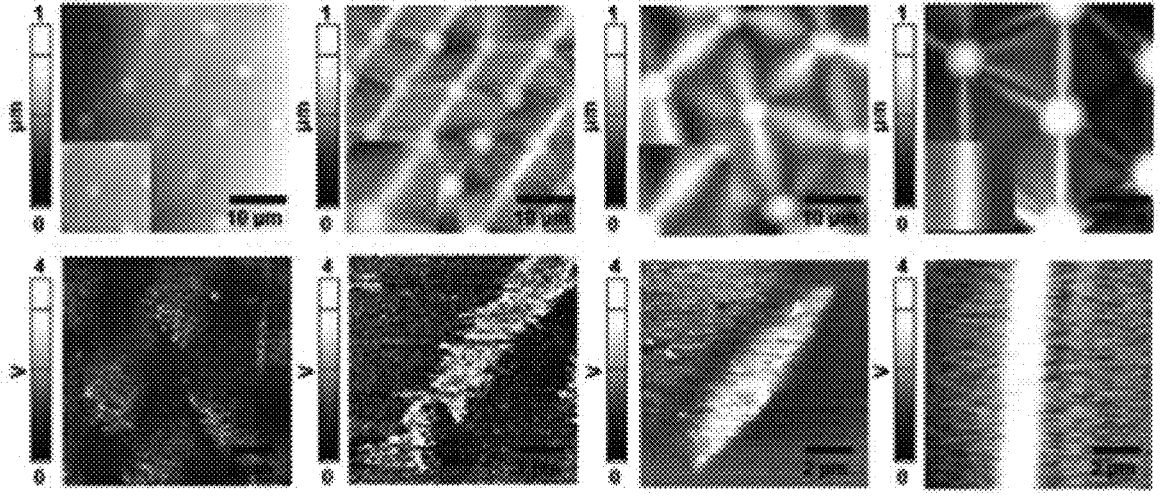
FIG. 22 shows the results of AFM (atomic force measurement) analysis of the microphone device in which $MoS_2$ is deposited on a top of a dome-shaped pattern.

FIG. 21 is a schematic diagram of a two-dimensional piezoelectric material layer formed by transferring $MoS_2$ onto a dome-shaped patterned substrate to form a pre-strain film. In this pre-strain film, the pre-strain is already applied in three directions, such that a $d_{33}$ piezoelectric coefficient that is not measured in the conventional two-dimensional piezoelectric material is obtained when strain is applied. FIG. 22 shows the results of AFM (atomic force measurement) analysis of the microphone device in which $MoS_2$ has been deposited on a top of a dome-shaped pattern. It was identified that a micro-scale pre-strain was applied to the top of $MoS_2$ due to the patterning, thereby increasing the electrical potential. Thus, when the two-dimensional piezoelectric material formed in the form of the pre-strain thin film is used in the microphone device, the $d_{33}$ piezoelectric coefficient appears, and thus simultaneous measurement of the piezoelectric characteristics in the $d_{11}$ and $d_{33}$ directions is achieved using the horizontally-arranged electrodes and the vertically-arranged electrodes (upper and lower electrodes). Thus, piezoelectric characteristics (piezoelectricity), sensitivity, and SNR (Signal of Noise Rate) may be improved, etc. In this way, the piezoelectric and sensing characteristics may be improved. In this regard, a diameter of the patterned dome-shape may be adjusted to several microscales based on a target value of the pre-strain.

EXAMPLE 4

Figure 23:
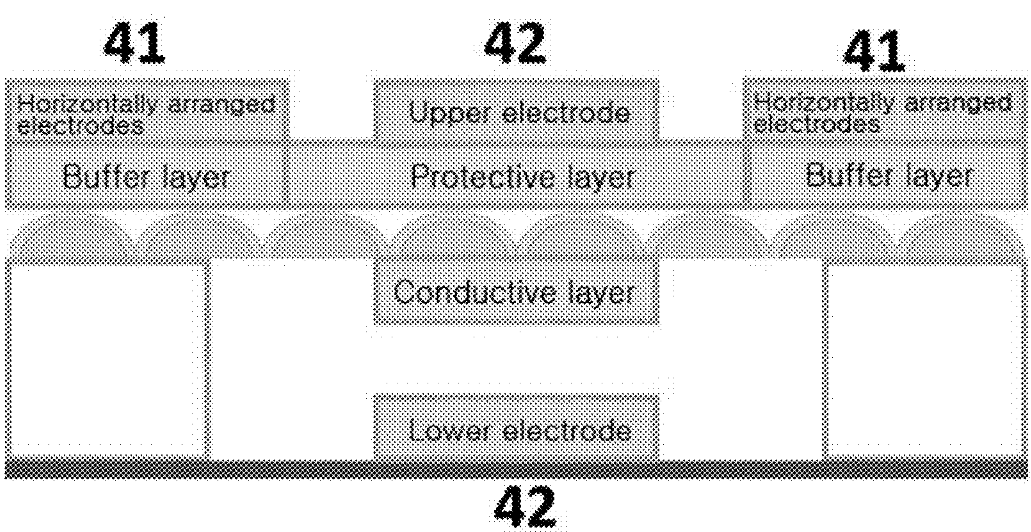
FIG. 23 shows a schematic diagram of a microphone device in which stability of a $d_{33}$ sensing element is enhanced via forming an additional layer.

FIG. 23 shows a schematic diagram of a microphone device in which stability of a $d_{33}$ sensing element is enhanced via forming an additional layer.

The stability of the $d_{33}$ sensing element may be improved through the production of an additional conductive layer in the basic structure. When $d_{33}$ is detected through the upper and lower electrodes, non-contact of the piezoelectric material layer with the upper and lower electrodes may occur in the low-frequency band in which the device vibrates in a slight manner, which is not case for $d_{11}$. This problem may be solved by depositing the conducive layer made of Mo, Cu, Al, Ag, Au, etc. on the lower surface of the lower protective layer to improve the sensing sensitivity in the low-frequency band. Furthermore, a buffer layer made of $C_3N_4$, CO, etc. may be deposited between the piezoelectric material layer and the horizontally-arranged electrodes so as to non-overlap the upper protective layer, thereby preventing problems that may occur due to differences in mechanical properties (lattice constant, thermal expansion coefficient, etc.) between the piezoelectric material layer and the horizontally-arranged electrodes. In addition, the upper protective layer made of $Al_2O_3$, $SiO_2$, etc. may be formed on the two-dimensional piezoelectric material layer to prevent the two-dimensional piezoelectric material layer from being contaminated and oxidized under the external environment.

Although embodiments of the present disclosure have been described with reference to the accompanying drawings, embodiments of the present disclosure are not limited to the above embodiments, but may be implemented in various different forms. A person skilled in the art may appreciate that the present disclosure may be practiced in other concrete forms without changing the technical spirit or essential characteristics of the present disclosure. Therefore, it should be appreciated that the embodiments as described above is not restrictive but illustrative in all respects.

What is claimed is:

1. A microphone device based on a two-dimensional piezoelectric material layer having a protective layer formed thereon, the microphone device comprising:

a substrate including a cavity vertically extending therethrough;

a lower protective layer formed on an upper surface of the substrate so as to block the cavity, wherein a plurality of surface structures, each having an upwardly gradually narrower shape, are arranged on the lower protective layer;

a two-dimensional piezoelectric material layer formed on the lower protective layer in a conformal manner to the plurality of surface structures of the lower protective layer such that a pre-strain is applied to the two-dimensional piezoelectric material layer; and at least one electrode, wherein the microphone device is configured to generate an electric potential as the two-dimensional piezoelectric material layer vibrates under a sound pressure.

2. The microphone device of claim 1, wherein the microphone device further comprises an upper protective layer formed on the two-dimensional piezoelectric material layer.

3. The microphone device of claim 2, wherein each of the lower protective layer and the upper protective layer is made of a material having a lattice parameter similar to a lattice parameter of the two-dimensional piezoelectric material layer.

4. The microphone device of claim 2, wherein each of the lower protective layer and the upper protective layer includes one of $Al_2O_3$, BN, hBN, $HfO_2$, $SiO_2$, ZnO, $TiO_2$.

5. The microphone device of claim 2, wherein at least one of the lower protective layer and the upper protective layer is patterned into a mesh structure.

6. The microphone device of claim 1, wherein the two-dimensional piezoelectric material layer is made of one of a transition metal chalcogenide, an alkaline earth metal oxide, and a group III-V compound.

7. The microphone device of claim 1, wherein the two-dimensional piezoelectric material layer includes a stack of 1 to 5 two-dimensional piezoelectric material layers.

8. The microphone device of claim 1, wherein a through-cavity has a circular shape in a plan view of the microphone device.

9. The microphone device of claim 1, wherein the microphone device further comprises:

an additional substrate disposed on the other surface of the substrate having the cavity defined therein so as to block the cavity; and a lower stopper disposed on the additional substrate so as to be received in the cavity.

10. The microphone device of claim 9, wherein the microphone device further comprises an upper stopper disposed on the upper protective layer.

11. The microphone device of claim 1, wherein a plurality of surface structures, each having an upwardly gradually narrower shape, are disposed and arranged on the substrate, wherein the lower protective layer is formed on the plurality of surface structures of the substrate in a conformal manner to the plurality of surface structures of the substrate, wherein the two-dimensional piezoelectric material layer is formed on the lower protective layer in a conformal manner to the plurality of surface structures of the substrate.

12. The microphone device of claim 1, wherein the microphone device further comprises a packaging layer disposed on a lower surface of the substrate so as to block the cavity, wherein the at least one electrode includes:

at least two horizontally-arranged electrodes disposed on the two-dimensional piezoelectric material layer, and arranged and spaced apart from each other in a horizontal direction;

an upper electrode disposed between adjacent ones of the at least two horizontally-arranged electrodes;

a lower electrode disposed on an upper surface of the packaging layer, wherein the plurality of surface structures, each having an upwardly gradually narrower shape, are disposed and arranged in and/or on in the lower protective layer, wherein the two-dimensional piezoelectric material layer is formed on the plurality of surface structures of the lower protective layer in a conformal manner to the plurality of surface structures of the lower protective layer such that a pre-strain is applied to the two-dimensional piezoelectric material layer.

13. The microphone device of claim 12, wherein the microphone device further comprises an upper protective layer formed on the two-dimensional piezoelectric material layer, wherein the horizontally-arranged electrodes and the upper electrode are disposed on the upper protective layer.

14. The microphone device of claim 12, wherein the microphone device further comprises a conductive layer attached to a lower surface of the lower protective layer and received in the cavity.

15. The microphone device of claim 1, wherein the microphone device further comprises a packaging layer disposed on a lower surface of the substrate so as to block the cavity, wherein the at least one electrode includes:

at least two horizontally-arranged electrodes disposed on the two-dimensional piezoelectric material layer, and arranged and spaced apart from each other in a horizontal direction;

an upper electrode disposed between adjacent ones of the at least two horizontally-arranged electrodes;

a lower electrode disposed on an upper surface of the packaging layer, wherein a plurality of surface structures, each having an upwardly gradually narrower shape, are disposed and arranged on the substrate, wherein the lower protective layer is formed on the plurality of surface structures of the substrate in a conformal manner to the plurality of surface structures of the substrate, wherein the two-dimensional piezoelectric material layer is formed on the lower protective layer in a conformal manner to the plurality of surface structures of the substrate.

16. The microphone device of claim 15, wherein the microphone device further comprises an upper protective layer formed on the two-dimensional piezoelectric material layer, wherein the horizontally-arranged electrodes and the upper electrode are disposed on the upper protective layer.

17. The microphone device of claim 15, wherein the microphone device further comprises a conductive layer attached to a lower surface of the lower protective layer and received in the cavity.

18. A method for manufacturing a microphone device based on a two-dimensional piezoelectric material layer having a protective layer formed thereon, the method comprising:

preparing a substrate;

forming a lower protective layer on an upper surface of the substrate, wherein a plurality of surface structures, each having an upwardly gradually narrower shape, are arranged on the lower protective layer;

forming a two-dimensional piezoelectric material layer on the lower protective layer in a conformal manner to the plurality of surface structures of the lower protective layer such that a pre-strain is applied to the two-dimensional piezoelectric material layer;

forming an upper protective layer on the two-dimensional piezoelectric material layer;

forming at least one electrode; and etching a lower surface of the substrate so as to form a cavity vertically extending through the substrate, wherein the microphone device is configured to generate an electric potential as the two-dimensional piezoelectric material layer vibrates under a sound pressure.

19. The method of claim 18, wherein each of the lower protective layer and the upper protective layer is made of a material having a lattice parameter similar to a lattice parameter of the two-dimensional piezoelectric material layer.

20. The method of claim 18, wherein each of the lower protective layer and the upper protective layer includes one of $Al_2O_3$, BN, hBN, $HfO_2$, $SiO_2$, ZnO, $TiO_2$.

21. The method of claim 19, wherein at least one of the lower protective layer and the upper protective layer is patterned into a mesh structure.

22. The method of claim 18, wherein the two-dimensional piezoelectric material layer is made of one of a transition metal chalcogenide, an alkaline earth metal oxide, and a group III-V compound.

23. The method of claim 18, wherein the two-dimensional piezoelectric material layer includes a stack of 1 to 5 two-dimensional piezoelectric material layers.

24. The method of claim 18, wherein each of the lower protective layer and the upper protective layer is formed using atomic layer deposition (ALD).

25. The method of claim 18, wherein the two-dimensional piezoelectric material layer is formed via sputtering and heat treatment.

26. The method of claim 18, wherein a plurality of surface structures, each having an upwardly gradually narrower shape, are disposed and arranged on the substrate, wherein the lower protective layer is formed on the plurality of surface structures of the substrate in a conformal manner to the plurality of surface structures of the substrate, wherein the two-dimensional piezoelectric material layer is formed on the lower protective layer in a conformal manner to the plurality of surface structures of the substrate.

* * * * *